United States Patent
Hsieh

(10) Patent No.: US 8,564,054 B2
(45) Date of Patent: Oct. 22, 2013

(54) TRENCH SEMICONDUCTOR POWER DEVICE HAVING ACTIVE CELLS UNDER GATE METAL PAD

(75) Inventor: Fu-Yuan Hsieh, New Taipei (TW)

(73) Assignee: Feei Cherng Enterprise Co., Ltd., New Taipei (TW)

(*) Notice: Subject to any disclaimer, the term of this patent is extended or adjusted under 35 U.S.C. 154(b) by 33 days.

(21) Appl. No.: 13/341,379

(22) Filed: Dec. 30, 2011

(65) Prior Publication Data

US 2013/0168764 A1    Jul. 4, 2013

(51) Int. Cl.
*H01L 27/148*      (2006.01)
*H01L 21/336*      (2006.01)

(52) U.S. Cl.
USPC .............. 257/331; 257/E29.118; 438/268

(58) Field of Classification Search
CPC ............ H01L 29/7813; H01L 29/4236; H01L 29/0696; H01L 29/66734
USPC .............. 257/331, 330, 220, 328, E29.118; 438/138, 212, 268, 270
See application file for complete search history.

(56) References Cited

U.S. PATENT DOCUMENTS

| 2009/0212321 | A1* | 8/2009  | Hsieh      | 257/139 |
|--------------|-----|---------|------------|---------|
| 2011/0068386 | A1* | 3/2011  | Tai et al. | 257/328 |
| 2011/0121386 | A1* | 5/2011  | Hsieh      | 257/334 |
| 2011/0233667 | A1* | 9/2011  | Tai et al. | 257/334 |
| 2011/0291186 | A1* | 12/2011 | Yilmaz et al. | 257/334 |

\* cited by examiner

*Primary Examiner* — Nikolay Yushin
(74) *Attorney, Agent, or Firm* — Bacon & Thomas, PLLC

(57) ABSTRACT

A trench semiconductor power device having active cells under gate metal pad to increase total active area for lowering on-resistance is disclosed. The gate metal pad is not only for gate wire bonding but also for active cells disposition. Therefore, the device die can be shrunk so that the number of devices per wafer is increased for die cost reduction. Moreover, the device can be packaged into smaller type package for further cost reduction.

24 Claims, 23 Drawing Sheets

TRENCH SEMICONDUCTOR POWER DEVICE HAVING ACTIVE CELLS UNDER GATE METAL PAD

FIELD OF THE INVENTION

This invention relates generally to the cell structure, device configuration and manufacturing process of trench semiconductor power devices. More particularly, this invention relates to an improved cell structure and device configuration to manufacture a trench semiconductor power device having active cells under gate metal pad.

BACKGROUND OF THE INVENTION

Conventional technologies for manufacturing trench semiconductor power devices are continuously challenged to further reduce the manufacturing cost by shrinking the size of a device die. Since 0.18 um technologies having trenched contacts filled with tungsten (W) contact metal plugs have been applied to semiconductor power devices, the active area of a trench semiconductor power device has been shrunk at least two times for low voltage products (<100 V). However, the size of a gate metal pad area is still kept the same as before for gate wire bonding (e.g., for 2 mil Au or Cu wire requires about 160 um×160 um gate metal pad while for 5 mil Al wire requires about 500 um×400 um gate metal pad). Therefore, the gate metal pad area becomes more pronounced (>10%) comparing to the active area of small devices, especially for the devices having gate metal pad bonded with Al wire. Please refer to FIG. 1 for a prior art showing a top view of a conventional trench MOSFET (Metal Oxide Semiconductor Field Effect Transistor) device where the dash-dotted line illustrates a source metal pad 101 and the dot pattern illustrates a gate metal pad 100. In FIG. 1, a plurality of closed active cells comprising multiple W contact metal plugs are only located underneath the source metal pad 101, and the gate metal pad 100 is only used for gate wire bonding by being connected to poly-silicon filled in gate trenches (as illustrated in FIG. 1) under the source metal pad 101 through at least one gate contact trench (as illustrated in FIG. 1) filled with the poly-silicon. Consequently, the gate metal pad 100 could become more pronounced comparing to the source metal pad area 101 as the device die shrinking, which could hamper cost reduction.

Therefore, there is still a need in the art of trench semiconductor power device, to provide a novel cell structure, device configuration and manufacturing process that would shrink the device die for cost reduction without sacrificing other performances and improve other characteristics of the trench semiconductor power device.

SUMMARY OF THE INVENTION

It is therefore an aspect of the present invention to provide a trench semiconductor power device so that the device die size can be reduced for cost reduction without sacrificing other performances of the trench semiconductor power device. According to the present invention, there is provided a trench semiconductor power device formed in a semiconductor layer comprising: a plurality of first type active cells under a source metal pad, each comprising a first type trenched source-body contact filled with a contact metal plug penetrating through a contact interlayer, a source region of a first conductivity type and extending into a body region of a second conductivity type between a pair of gate trenches filled with poly-silicon padded by a gate insulation layer; a plurality of second type active cells under a gate metal pad and insulated from said gate metal pad by an inter-metal isolation layer, each comprising a second type trenched source-body contact filled with the contact metal plug penetrating through the contact interlayer, the source region and extending into the body region between a pair of the gate trenches filled with the poly-silicon padded by the gate insulation layer; wherein under both the source metal pad and the gate metal pad, the source region and the body region are connected to the source metal pad through the contact metal plug, the poly-silicon filled into the gate trenches are connected to the gate metal pad. The semiconductor power device can be formed as a trench MOSFET, and the semiconductor layer comprises an epitaxial layer of the first conductivity type extending over a substrate of the first conductivity type. The semiconductor power device can also be formed as a trench IGBT (Insulated Gate Bipolar Transistor), and the semiconductor layer comprises an second epitaxial layer of the first conductivity type onto an first epitaxial layer of the first conductivity type, which has a higher doping concentration than the second epitaxial layer, extending over a substrate of the second conductivity type.

Some preferred embodiments include one or more detail features as followed: the semiconductor layer comprises an second epitaxial layer of the first conductivity type onto an first epitaxial layer of the first conductivity type which is extending over a substrate of the second conductivity type; the semiconductor layer comprises an epitaxial layer of the first conductivity type extending over a substrate of the first conductivity type; the first type active cells under the source metal pad are stripe cells and the first type trenched source-body contact is stripe source-body contact; the first type active cells under the source metal pad are closed cells and the first type trenched source-body contact is closed source-body contact; the second type active cells under the gate metal pad are stripe cells and the second type trenched source-body contact is stripe source-body contact; the second type active cells under the gate metal pad are closed cells and the second type trenched source-body contact is closed source-body contact; the contact metal plug filled in each the second type trenched source-body contact is further extending sandwiched between a top surface of the contact interlayer and a rear surface of the inter-metal isolation layer and is further connected together to act as a contact metal layer to connect the second type active cells under the gate metal pad to the source metal pad; the contact metal plug filled in each the second type trenched source-body contact and each the first type trenched source-body contact is further extending sandwiched between a top surface of the contact interlayer and a rear surface of the inter-metal isolation layer and is further connected together to act as a contact metal layer to connect the second type active cells and the first type active cells to the source metal pad; the contact metal layer is separated from the gate metal pad by a metal undercut and the inter-metal isolation layer in horizontal direction and in vertical direction, respectively; the contact metal layer is separated from the gate metal pad by the inter-metal isolation layer both in horizontal direction and in vertical direction; the source region has a higher doping concentration and a greater junction depth along sidewalk of each the first type trenched source-body contact and each the second type trenched source-body contact than along an adjacent channel region near the gate trenches at a same distance from a top surface of the semiconductor layer, and the source region has a doping profile of Gaussian-distribution along the top surface of the semiconductor layer from the sidewalls of each the first type trenched source-body contact and each the second type trenched source-body contact to the adjacent channel region; the source region has a same doping concentration and a same junction depth at a same distance from a top surface of the semiconductor layer; the trench semiconductor power device further comprising at least one gate contact trench filled with the poly-silicon padded by the gate insulation layer and having a greater trench width than the gate trenches; the trench semiconductor power device further comprising a trenched gate contact filled with the contact metal plug and penetrating through the contact interlayer and extending into the poly-silicon filled in the gate contact trench to be connected to the gate metal pad for gate connection; the trench semiconductor power device further comprising a termination area comprising multiple terminal trenches being spaced apart by the body region, wherein the multiple terminal trenches are filled with the poly-silicon having a floating voltage to function as trenched floating rings for the termination area; the contact metal plug is a tungsten (W) plug padded by a barrier metal layer of Ti/TiN or Co/TiN or Ta/TiN.

It is therefore another aspect of the present invention to provide a method of manufacturing a trench semiconductor power device. The method comprises forming active cells under a gate metal pad, wherein the active cells under the gate metal pad are connected to a source metal pad and are insulated from the gate metal pad.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
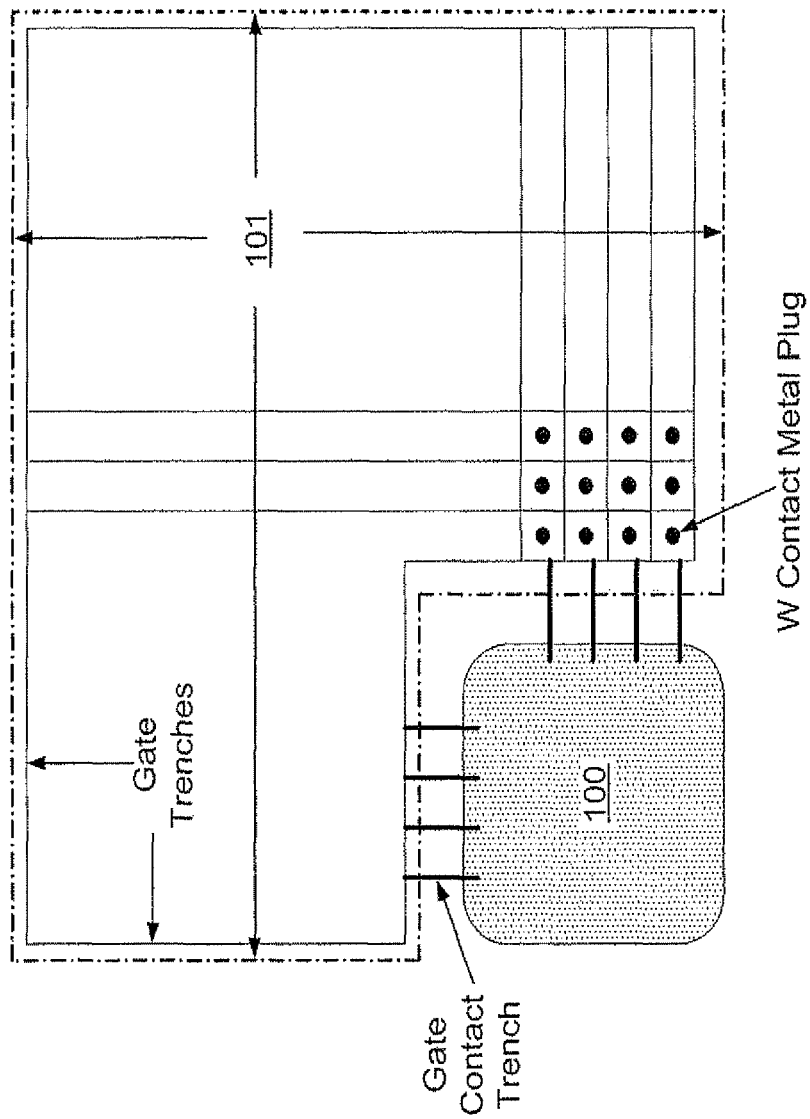
FIG. 1 is a top view of a prior art showing a conventional trench MOSFET.
Figure 2A:
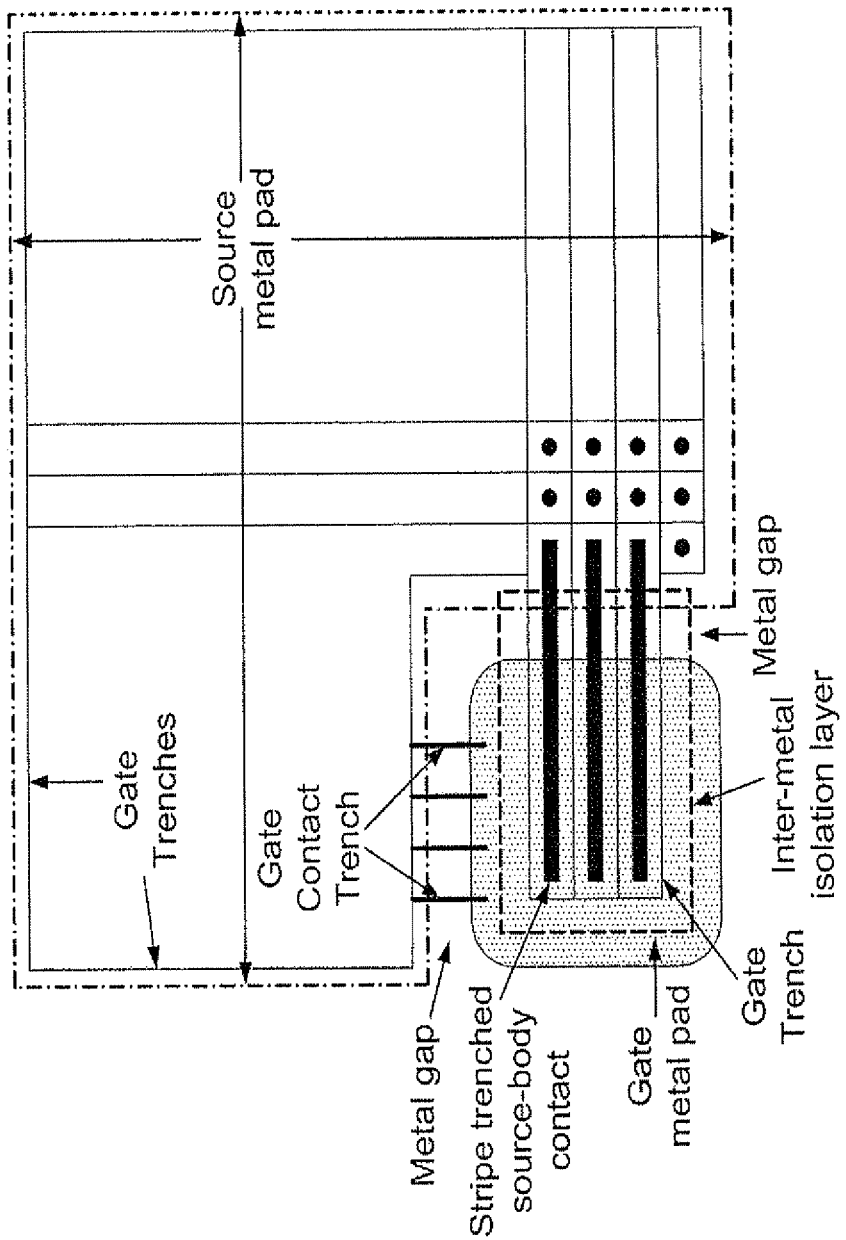
FIG. 2A is a top view of a preferred embodiment for a trench semiconductor power device according to the present invention.

In the following Detailed Description, reference is made to the accompanying drawings, which forms a part hereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be make without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise, Please refer to FIG. 2A for a preferred embodiment of this invention, wherein a trench semiconductor power device is shown having a plurality of first type active cells, which are closed active cells, under a source metal pad illustrated by a dash-dotted line while having a plurality of second type active cells, which are stripe active cells, under a gate metal pad illustrated by dot pattern, wherein the source metal pad is separated from the gate metal pad by a metal gap. Under the source metal pad, there are a plurality of gate trenches lined by a gate insulation layer and filled with poly-silicon which is connected to the gate metal pad via at least one gate contact trench lined by the gate insulation layer and filled with the poly-silicon, as illustrated in FIG. 2A. Meanwhile, according to the present invention, the gate metal pad is not only used for gate wire bonding, but also for the stripe active cells disposition, and each of the stripe active cells under the gate metal pad is connected to the source metal pad via a stripe trenched source-body contact filled with contact metal plug and are insulated from the gate metal pad by an inter-metal isolation layer which is illustrated by a dashed line.

Figure 2B:
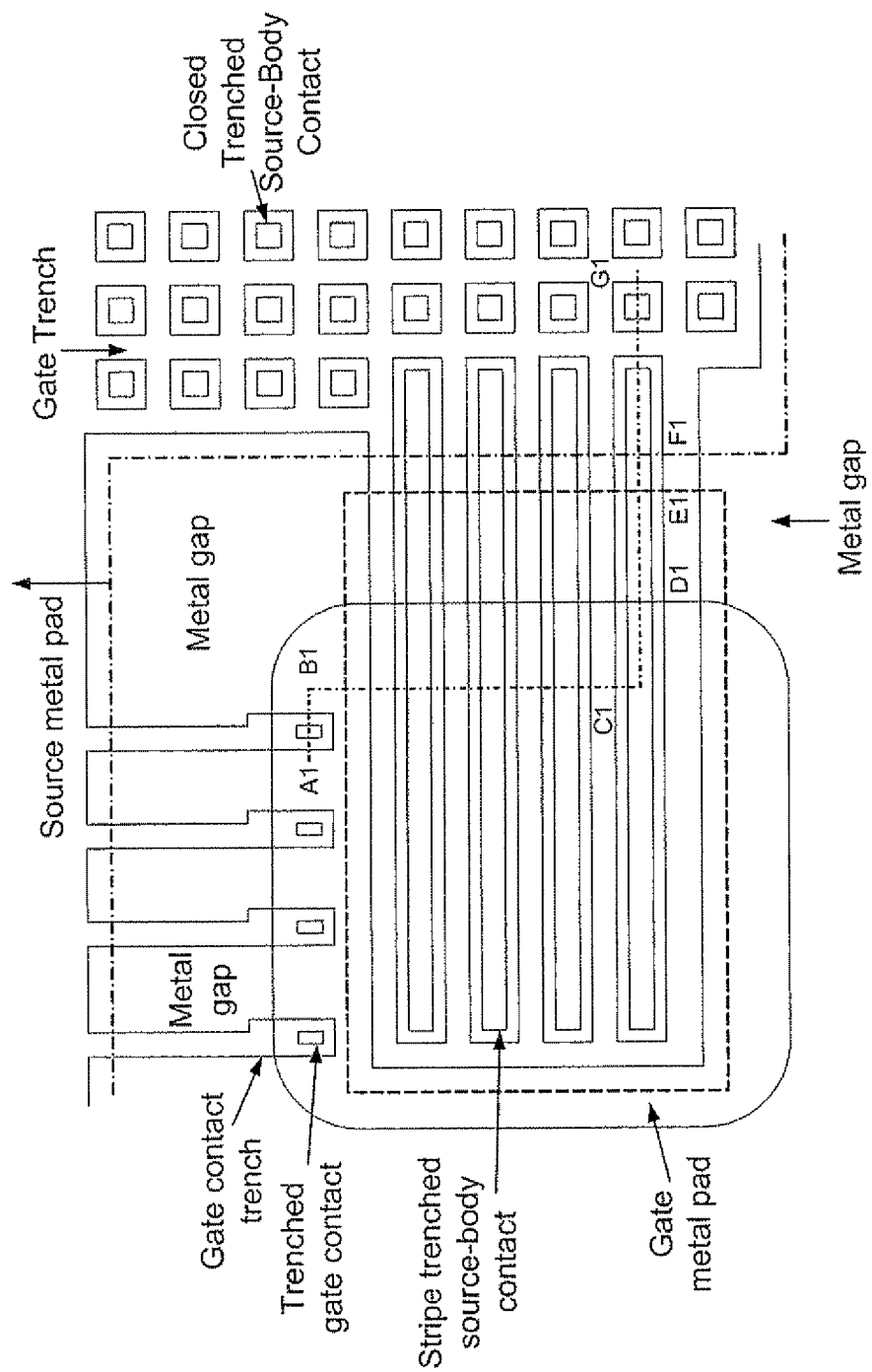
FIG. 2B is a partial enlarged top view of the preferred embodiment in FIG. 2A for showing the active cells under gate metal pad connected to the source metal pad of the trench semiconductor power device according to the present invention.

FIG. 2B is a partial enlarged view of FIG. 2A for showing the stripe active cells under the gate metal pad connected to the source metal pad, where each of the stripe active cells under the gate metal pad is electrically connected to the source metal pad through the contact metal plug filled in a second type trenched source-body contact, which is a stripe trenched source-body contact as illustrated in FIG. 2B, meanwhile, each of the closed active cells under the source metal pad is electrically connected to the source metal pad through the contact metal plug filled in a first type trenched source-body contact, which is a closed trenched source-body contact, as illustrated in FIG. 2I3. Furthermore, each the gate contact trench lined by the gate insulation layer and filled with the poly-silicon is connected to the gate metal pad through the contact metal plug filled in a trenched gate contact, as illustrated in FIG. 2I3. Wherein the contact metal plug can be a tungsten (W) plug padded by a barrier metal layer of Ti/TiN or Co/TiN or Ta/TiN. The gate metal pad and the source metal pad are separated by the metal gap. The stripe active cells under the gate metal pad increase the total active area of the trench semiconductor power device, leading to a lower on-resistance. Moreover, the device die can be shrunk to increase the number of devices per wafer for die cost reduction and the device can be packaged into a smaller type package for further cost reduction.

Figure 2C:
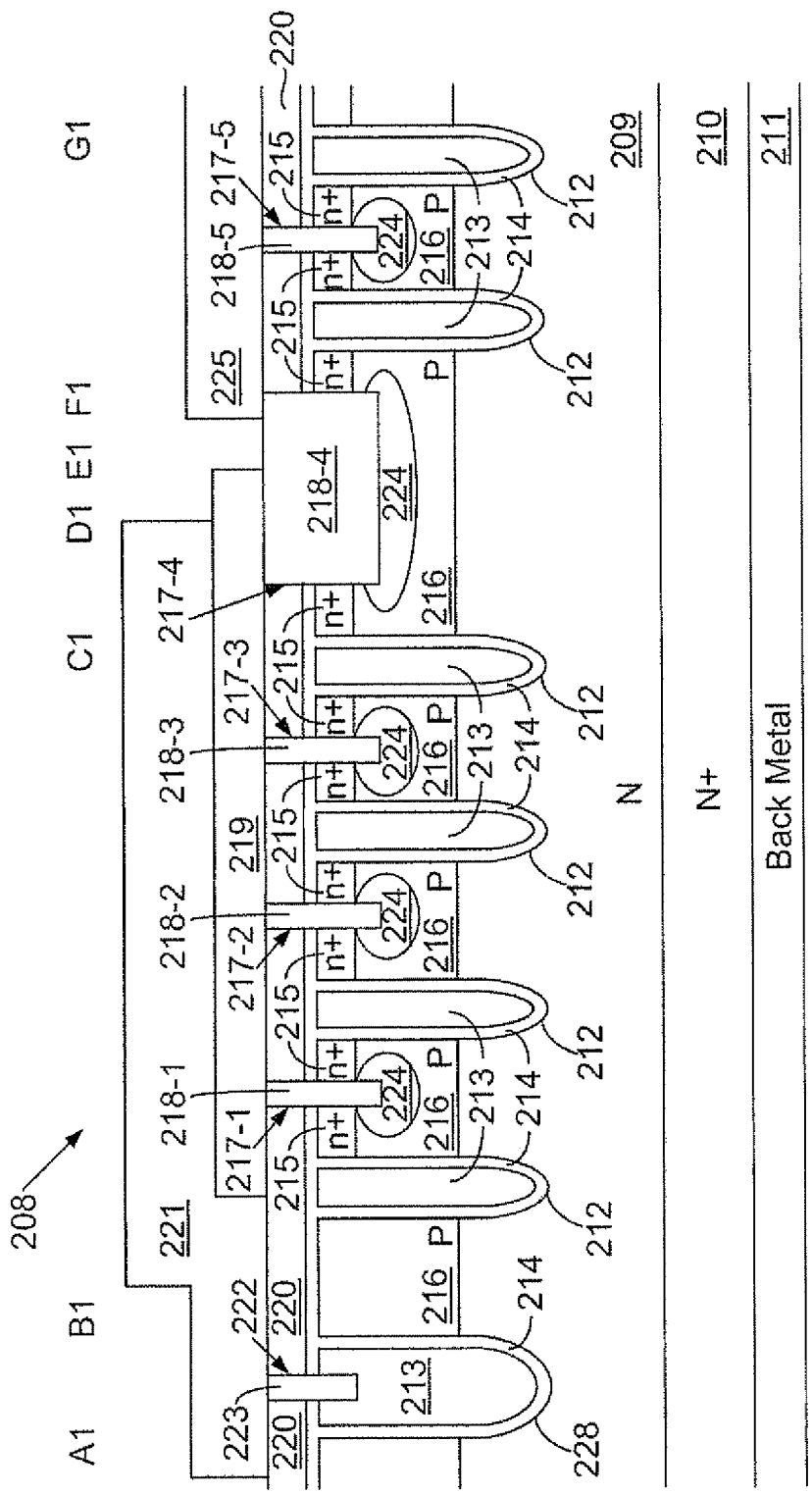
FIG. 2C is a cross-sectional view showing a preferred embodiment according to the present invention, which is also a preferred A1-B1-C1-D1-E1-F1-G1 cross section of FIG. 2B.

FIG. 2C is a cross-sectional view showing a preferred embodiment of the present invention, which is also a preferred A1-B1-C1-D1-E1-F1-G1 cross section of FIG. 2B, wherein an N-channel trench MOSFET 208 is disclosed with a plurality of stripe active cells under the gate metal pad 221 and a plurality of closed stripe cells under the source metal pad 225. The N-channel trench MOSFET 208 is formed in a semiconductor layer which can be implemented by comprising an N epitaxial layer 209 above a heavily doped N+ substrate 210 coated with a back metal of Ti/Ni/Ag on rear side as a drain metal 211. In the trench MOSFET 208, the gate metal pad 221 is not only for gate wire bonding but also for the stripe active cells disposition, the stripe active cells under the gate metal pad 221 are insulated from the gate metal pad 221 by the inter-metal isolation layer 219. Due to the inter-metal isolation layer 219 introduced into the trench MOSFET 208, an additional inter-metal isolation layer mask is needed in the manufacturing process of the trench MOSFET 208. Each of the stripe active cells under the gate metal pad 221 is connected to the source metal pad 225 through the contact metal plug (218-1, 218-2, 218-3, or 218-4) filled in a stripe trenched source-body contact (217-1, 217-2, 217-3, or 217-4, wherein the stripe trenched source-body contact 217-4 shows a different direction from the other stripe trenched source-body contact); each of the closed active cells under the source metal pad 225 is connected to the source metal pad 225 through the contact metal plug 218-5 filled in a closed trenched source-body contact 217-5, wherein each the contact metal plug (218-1~218-5) can be a tungsten (W) plug padded by a barrier metal layer of Ti/TiN or Co/TiN or Ta/TiN, penetrating through a contact interlayer 220, an n+ source region 215 and extending into a P body region 216 between a pair of gate trenches 212 each filled with the poly-silicon layer 213 padded by the gate insulation layer 214. Each the n+ source region 215 has a same doping concentration and a same junction depth at a same distance from a top surface of the N epitaxial layer 209. The trench MOSFET 208 further comprises at least one gate contact trench 228 filled with the poly-silicon layer 213 padded by the gate insulation layer 214, wherein the poly-silicon layer 213 in the gate contact trench 228 is connected to the gate metal pad 221 of the trench MOSFET 208 for gate connection via a trenched gate contact 222 filled with the contact metal plug 223 which is also can be implemented by the tungsten plug padded by the barrier metal layer (the same material as the contact metal plug 218-1~218-5). A p+ body contact region 224 having a higher doping concentration than the P body region 216 is formed under the n+ source region 215 and surrounding at least bottom of each the stripe trenched source-body contact (217-1~217-5) and each the closed trenched source-body contact (217-5) to reduce a contact resistance between the P body region 216 and each the contact metal plug (218-1~218-5).

Figure 2D:
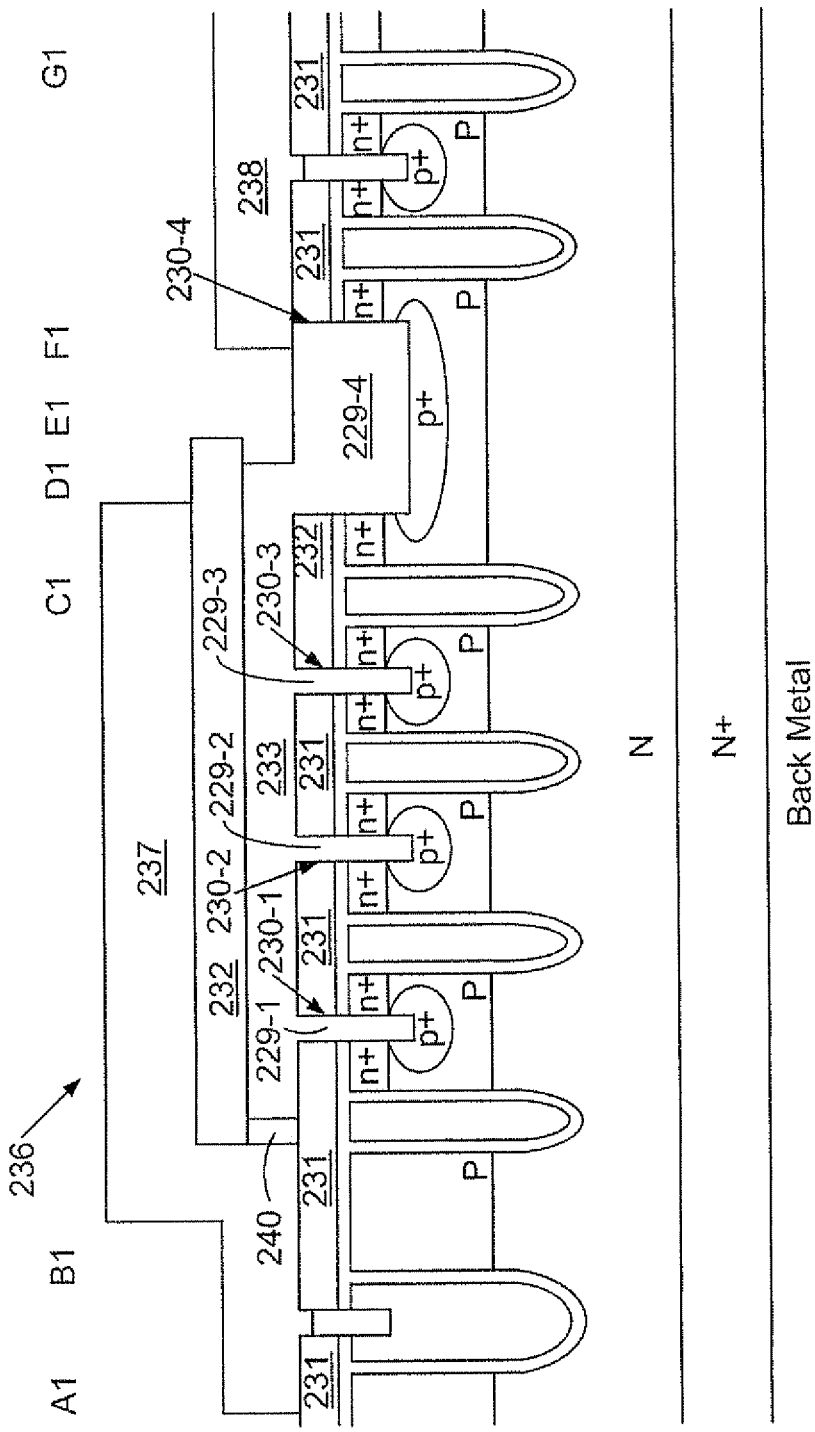
FIG. 2D is a cross-sectional view showing another preferred embodiment according to the present invention, which is also another preferred A1-B1-C1-D1-E1-F1-G1 cross section of FIG. 2B.

FIG. 2D is a cross-sectional view showing another preferred embodiment of the present invention, which is also another preferred A1-B1-C1-D1-E1-F1-G1 cross section of FIG. 2B, wherein an N-channel trench MOSFET 236 is disclosed with a plurality of stripe active cells under the gate metal pad 237 and a plurality of closed active cells under the source metal pad 238. The trench MOSFET 236 in FIG. 2D is similar to the trench MOSFET 208 in FIG. 2C except that, in FIG. 2D, all the contact metal plugs (229-1, 229-2, 229-3 and 229-4) filled in all the stripe trenched source-body contacts (230-1, 230-2, 230-3 and 230-4) are further extending sandwiched between a top surface of the contact interlayer 231 and a bottom surface of the inter-metal isolation layer 232 and are connected together to act as a contact metal layer 233 to connect the stripe active cells under the gate metal pad 237 to the source metal pad 238 for better contact performance because the contact metal layer 233 has a lower resistance than the contact metal plug (218-1~218-4) of the trench MOSFET 208 in FIG. 2C, wherein the contact metal layer 233 is separated from the gate metal pad 237 by a metal undercut 240 and by the inter-metal isolation layer 232 in horizontal direction and in vertical direction, respectively.

Figure 3A:
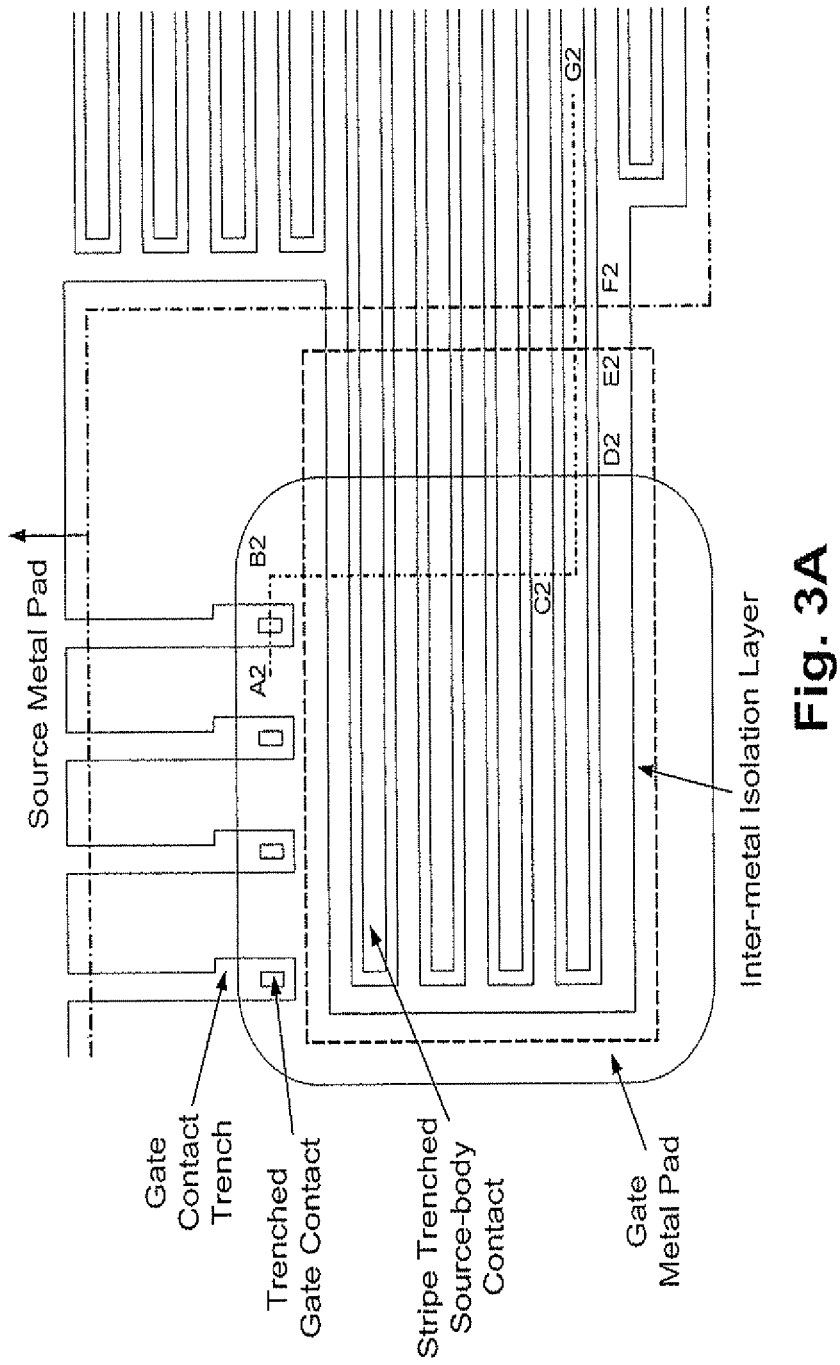
FIG. 3A is a top view of another preferred embodiment for a trench semiconductor power device according to the present invention.

FIG. 3A is a top view of another preferred embodiment for a trench semiconductor power device according to the present invention, which has a similar structure to FIG. 2A, except that, The trench semiconductor power device in FIG. 3A comprises a plurality of first type active cells, which are stripe active cells, under a source metal pad while comprising a plurality of second type active cells, which are also stripe active cells, under a gate metal pad. Wherein each of the stripe active cells under the source metal pad is connected to the source metal pad through a first type trenched source-body contact, which is a stripe trenched source-body contact, filled with a contact metal plug, while each of the stripe active cells under the gate metal pad is connected to the source metal pad through a second type trenched source-body contact, which is also a stripe trenched source-body contact, filled with the contact metal plug.

Figure 3B:
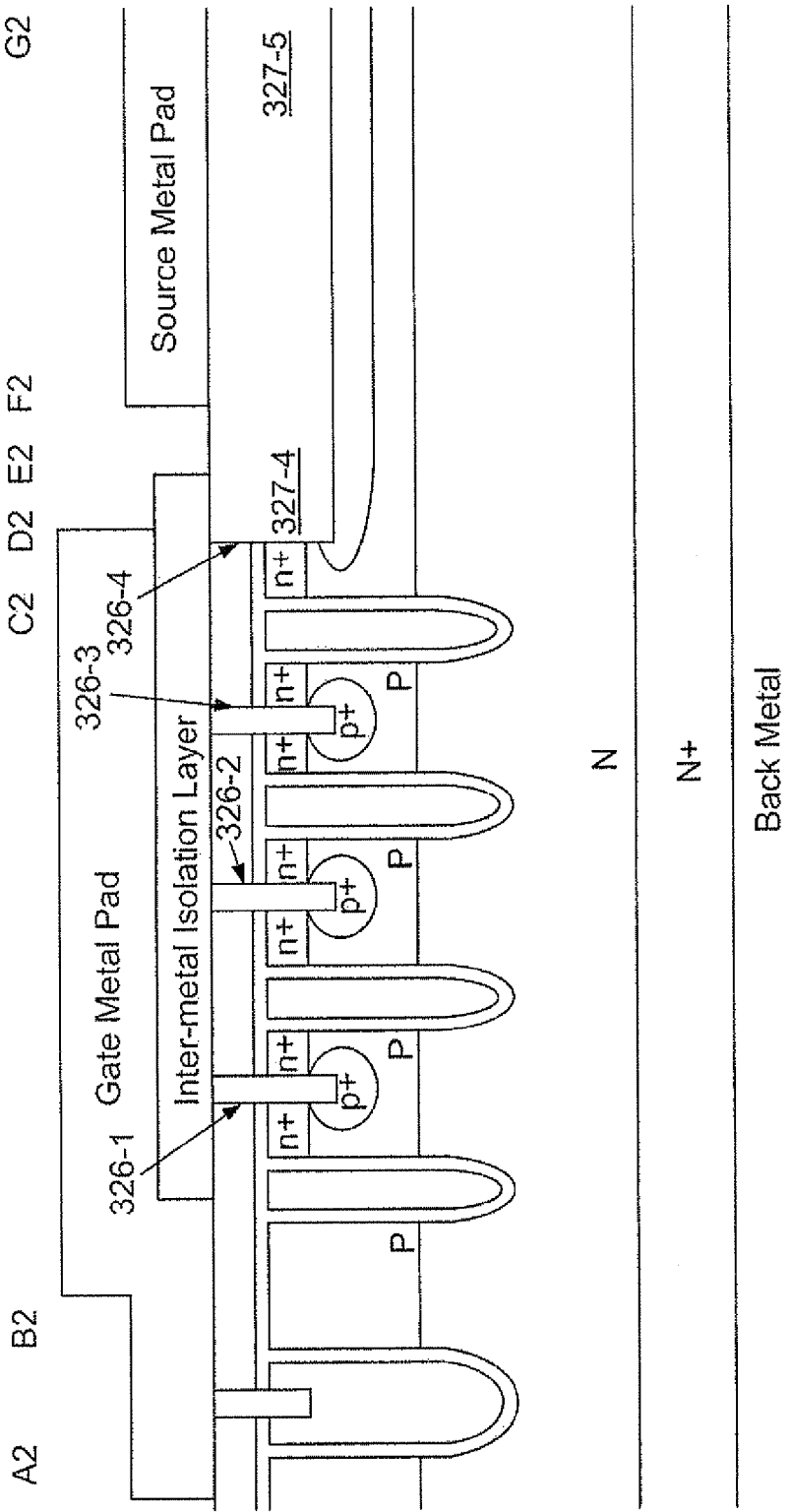
FIG. 3B is a cross-sectional view showing another preferred embodiment according to the present invention, which is also a preferred A2-B2-C2-D2-E2-F2-G2 cross section of FIG. 3A.

FIG. 3B is a cross-sectional view showing another preferred embodiment of the present invention, which is also a preferred A2-B2-C2-D2-E2-F2-G2 cross section of FIG. 3A. The structure of FIG. 3B is similar to the structure of FIG. 2C except that, in FIG. 3B, the contact metal plug 327-5 under the source metal pad and the contact metal plug 327-4 under the gate metal pad are directly connected together and sharing a same stripe trenched source-body contact 326-4, which are the same as the other stripe trenched source-body contact (326-1, 326-2 or 326-3, which shows a different direction from 326-4).

Figure 4A:
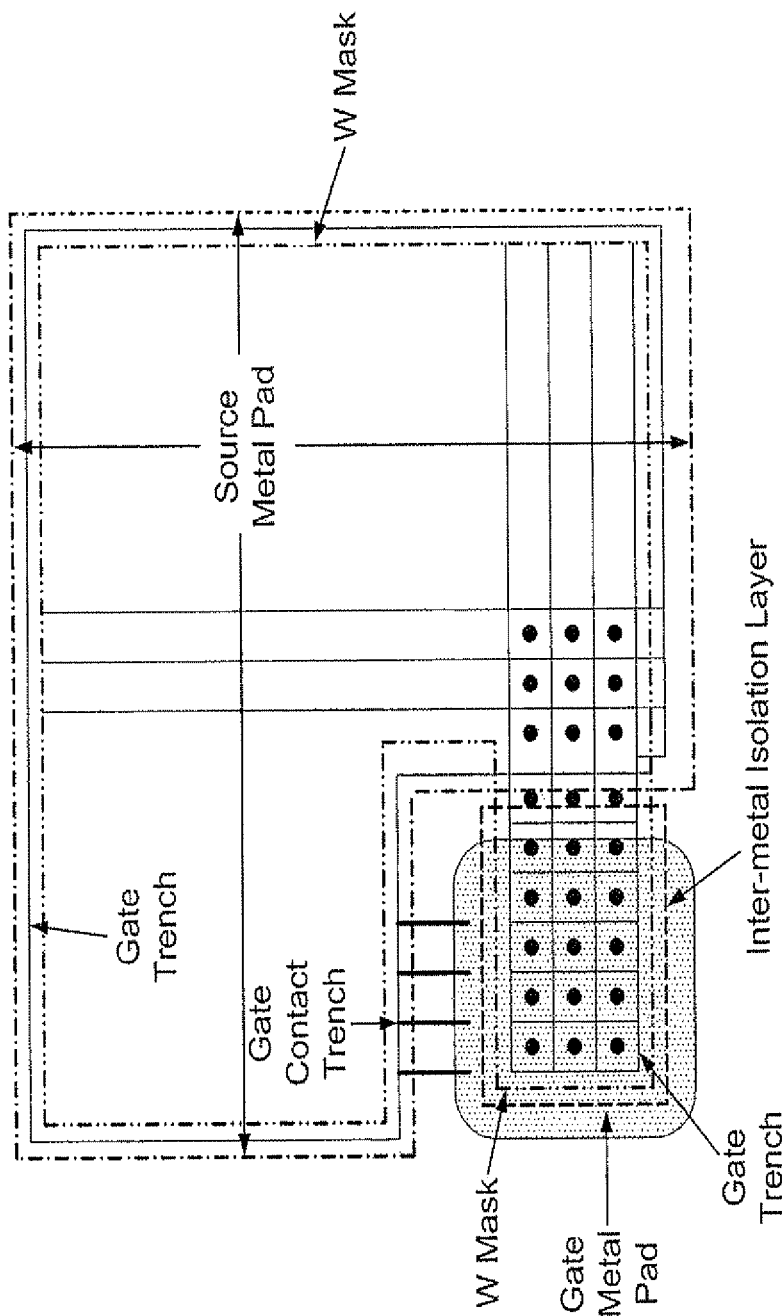
FIG. 4A is a top view of another preferred embodiment for a trench semiconductor power device according to the present invention.
Figure 4B:
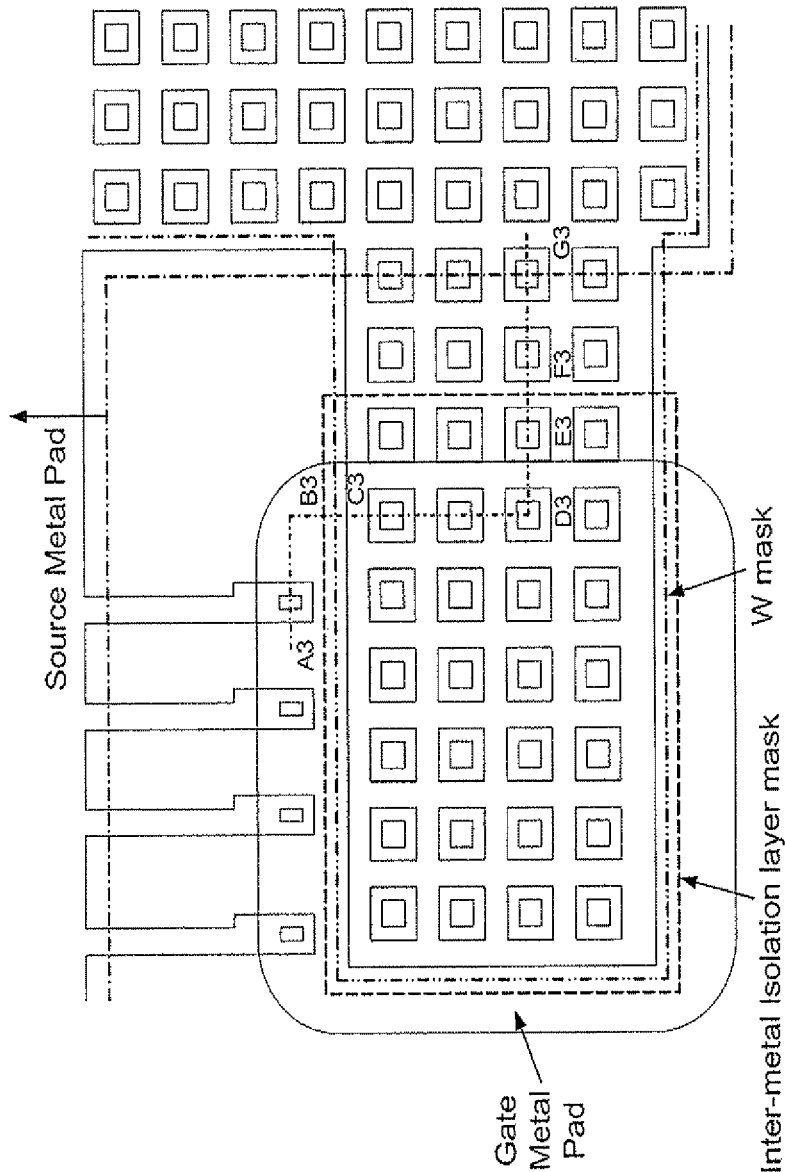
FIG. 4B is a partial enlarged top view of the preferred embodiment for showing the active cells under the gate metal pad connected to the source metal pad of the trench semiconductor power device according to the present invention.

FIG. 4A is a top view of another preferred embodiment for a trench semiconductor power device according to the present invention, which has a similar structure to FIG. 2A, except that, The trench semiconductor power device in FIG. 4 comprises a plurality of first type active cells, which are closed active cells, under a source metal pad while comprising a plurality of second type active cells, which are also closed active cells, under a gate metal pad. Wherein each of the closed active cells under the source metal pad is connected to the source metal pad through a first type trenched source-body contact, which is a closed trenched source-body contact, filled with a contact metal plug, while each of the closed active cells under the gate metal pad is connected to the source metal pad through a second type trenched source-body contact, which is also a closed trenched source-body contact, filled with the contact metal plug. FIG. 4B is a partial enlarged view of FIG. 4A for showing the closed active cells under the gate metal pad connected to the source metal pad of the trench semiconductor power device.

Figure 4C:
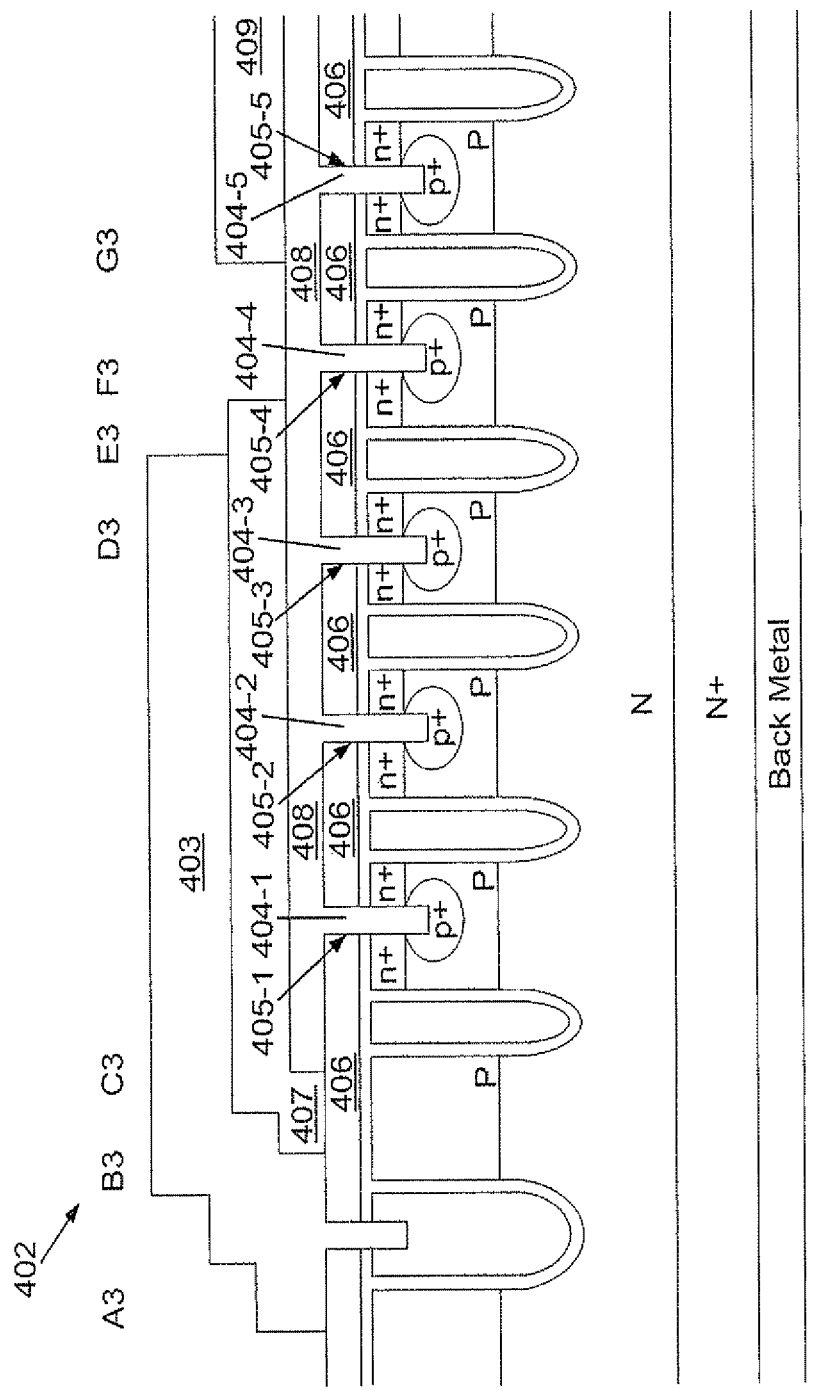
FIG. 4C is a cross-sectional view showing another preferred embodiment according to the present invention, which is also a preferred A3-B3-C3-D3-E3-F3-G3 cross section of FIG. 4E.

FIG. 4C is a cross-sectional view showing another preferred embodiment according to the present invention, which is also a preferred A3-B3-C3-D3-E3-F3-G3 cross section of FIG. 4B, wherein an N-channel trench MOSFET 402 is shown with a plurality of closed active cells under the gate metal pad 403. The trench MOSFET 402 in FIG. 4C is similar to the trench MOSFET 208 in FIG. 2C except that, in FIG. 4C, each the contact metal plug (404-1, 404-2, 404-3, 404-4 or 404-5) is filled in each the according closed trenched source-body contact (405-1, 405-2, 405-3, 405-4, or 405-5) and is further extending onto a top surface of a contact interlayer 406 and below an inter-metal isolation layer 407 and a source metal pad 409 to act as a contact metal layer 408 to connect the closed active cells both under the gate metal pad 403 and under the source metal pad 409 to the source metal pad 409. Due to the inter-metal isolation layer 407 introduced into the trench MOSFET 402 and the contact metal layer 408, an additional inter-metal isolation layer mask and a W mask (as illustrated in FIG. 4B) are needed in the manufacturing process of the trench MOSFET 402. Compared to the trench MOSFET 208, the contact metal layer 408 of the trench MOSFET 402 has a lower resistance than the contact metal plug (218-1, 218-2, and 218-3) of the trench MOSFET 208.

Figure 5A:
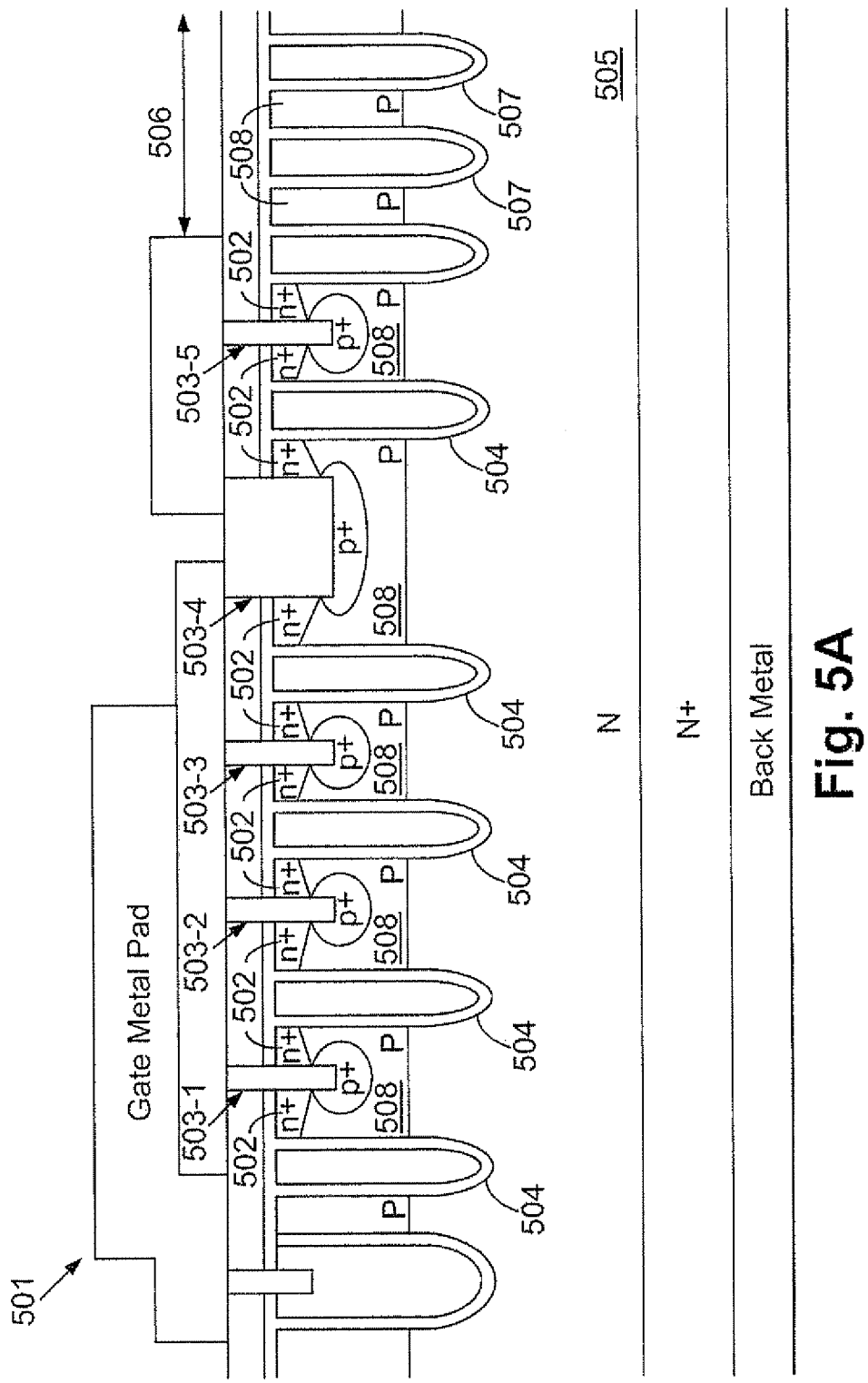
FIG. 5A is a cross-sectional view of another preferred embodiment for a trench semiconductor power device according to the present invention.

FIG. 5A is a cross-sectional view of another preferred embodiment for a trench semiconductor power device 501 according to the present invention. The structure of FIG. 5A is similar to the structure of FIG. 2C except that, in FIG. 5A, each the n+ source region 502 has a higher doping concentration and a greater junction depth along sidewalls of each the trenched source-body contact (503-1, 503-2, 503-3, 503-4, or 503-5) higher than along an adjacent channel region near the gate trenches 504 at a same distance from a top surface of the N epitaxial layer 505, and each the n+ source region 502 has a doping profile of Gaussian-distribution along the top surface of the N epitaxial layer 505 from the sidewalls of the trenched source-body contact (503-1, 503-2, 503-3, 503-4, and 503-5) to the adjacent channel region. And the trench semiconductor power device 501 further comprises a termination area 506 comprising multiple terminal trenches 507 being spaced apart by the P body region 508, wherein the multiple terminal trenches 507 are filled with poly-silicon having a floating voltage to function as trenched floating rings for the termination area 506. The doping concentration and junction depth profile of the n+ source regions 502 would result in a better avalanche capability (U.S. Pat. No. 7,816,720).

Figure 5B:
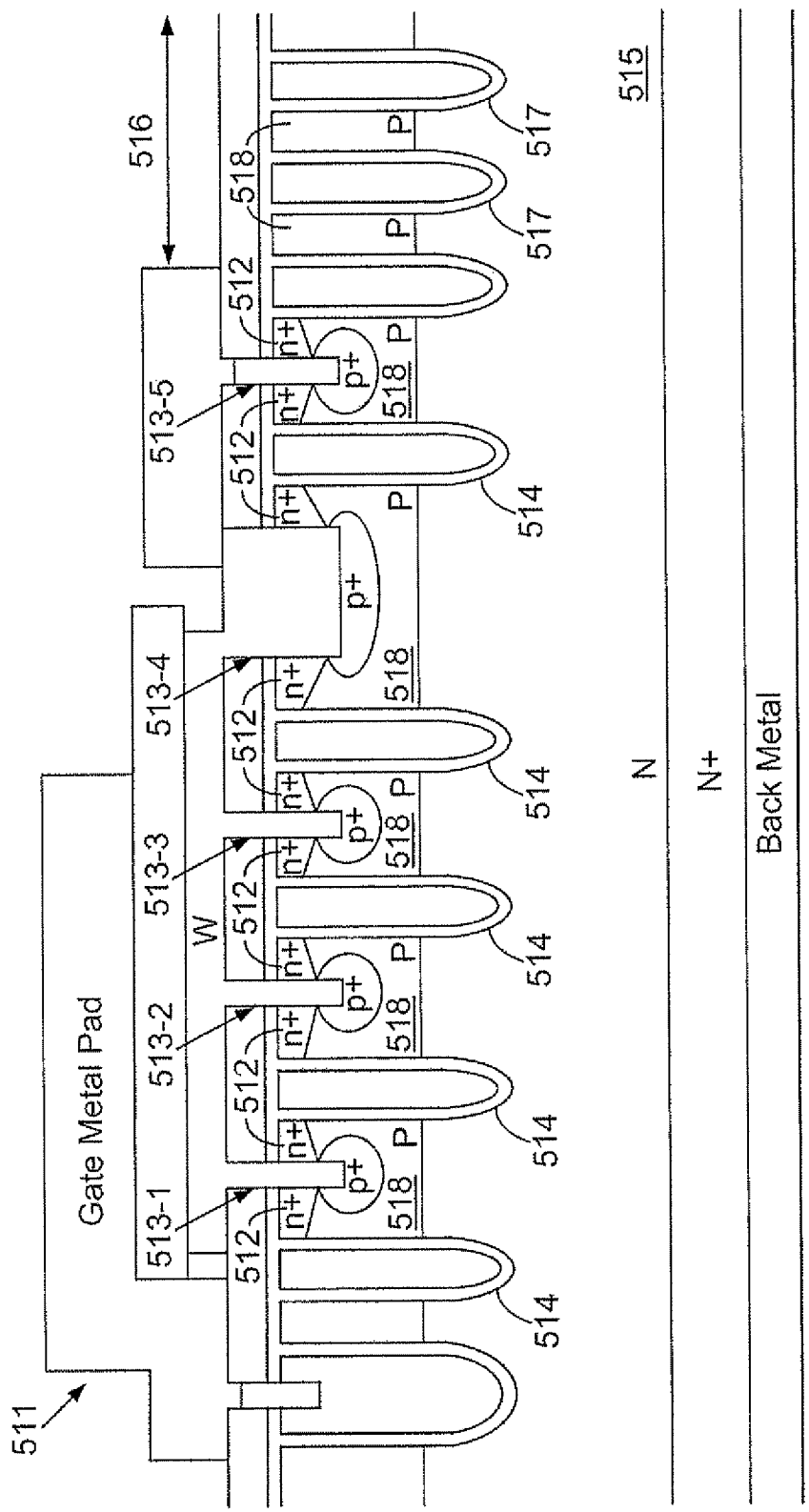
FIG. 5B is a cross-sectional view of another preferred embodiment for a trench semiconductor power device according to the present invention.

FIG. 5B is a cross-sectional view of another preferred embodiment for a trench semiconductor power device 511 according to the present invention. The structure of FIG. 5B is similar to the structure of FIG. 2D except that, in FIG. 5B, each the n+ source region 512 has a higher doping concentration and a greater junction depth along sidewalls of each the trenched source-body contact (513-1, 513-2, 513-3, 513-4, or 513-5) higher than along an adjacent channel region near the gate trenches 514 at a same distance from a top surface of the N epitaxial layer 515, and each the n+ source region 512 has a doping profile of Gaussian-distribution along the top surface of the N epitaxial layer 515 from the sidewalls of the trenched source-body contact (513-1, 513-2, 513-3, 513-4, or 513-5) to the adjacent channel region. And the trench semiconductor power device 511 further comprises a termination area 516 comprising multiple terminal trenches 517 being spaced apart by the P body region 518, wherein the multiple terminal trenches 517 are filled with poly-silicon having a floating voltage to function as trenched floating rings for the termination area 516. The doping concentration and junction depth profile of the n+ source regions 512 would result in a better avalanche capability (U.S. Pat. No. 7,816,720).

Figure 6A:
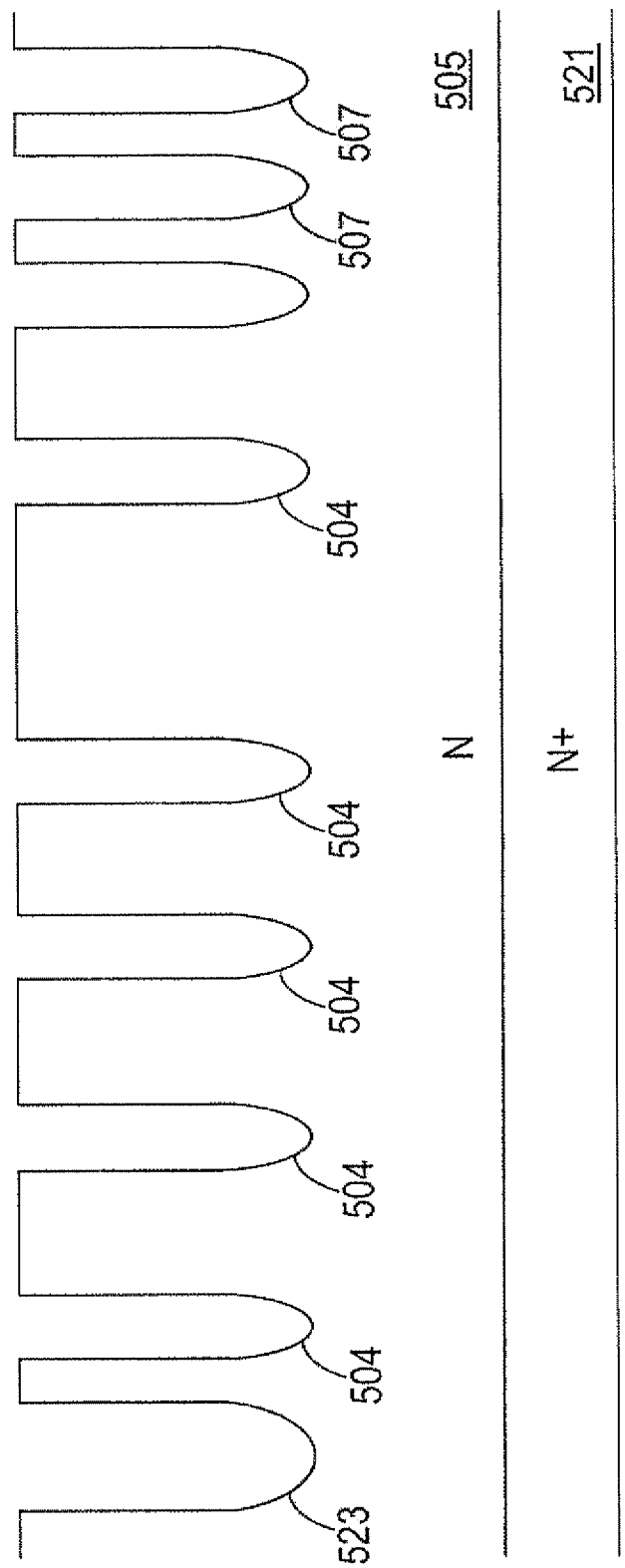
FIGS. 6A to 6G are a serial of cross-sectional views for showing the process steps for manufacturing a trench semiconductor power device as shown in FIG. 5A.

FIGS. 6A to 6G are a serial of cross-sectional views for showing the process steps for manufacturing a trench semiconductor power device as shown in FIG. 5A. Referring to FIG. 6A, an N epitaxial layer 505 is initially grown on a heavily doped N+ substrate 521. In the case of a trench IGBT, the N epitaxial layer is initially grown on another N+ epitaxial layer over a heavily doped P+ substrate. Next, a trench mask (not shown) is applied and followed by a trench etching process to define a plurality of trenches in the N epitaxial layer 505, including a plurality of gate trenches 504, multiple terminal trenches 507 and at least one gate contact trench 523. Then, a sacrificial oxide layer (not shown) is grown and etched away to remove the plasma damaged silicon layer formed during the process of opening all the trenches.

Figure 6B:
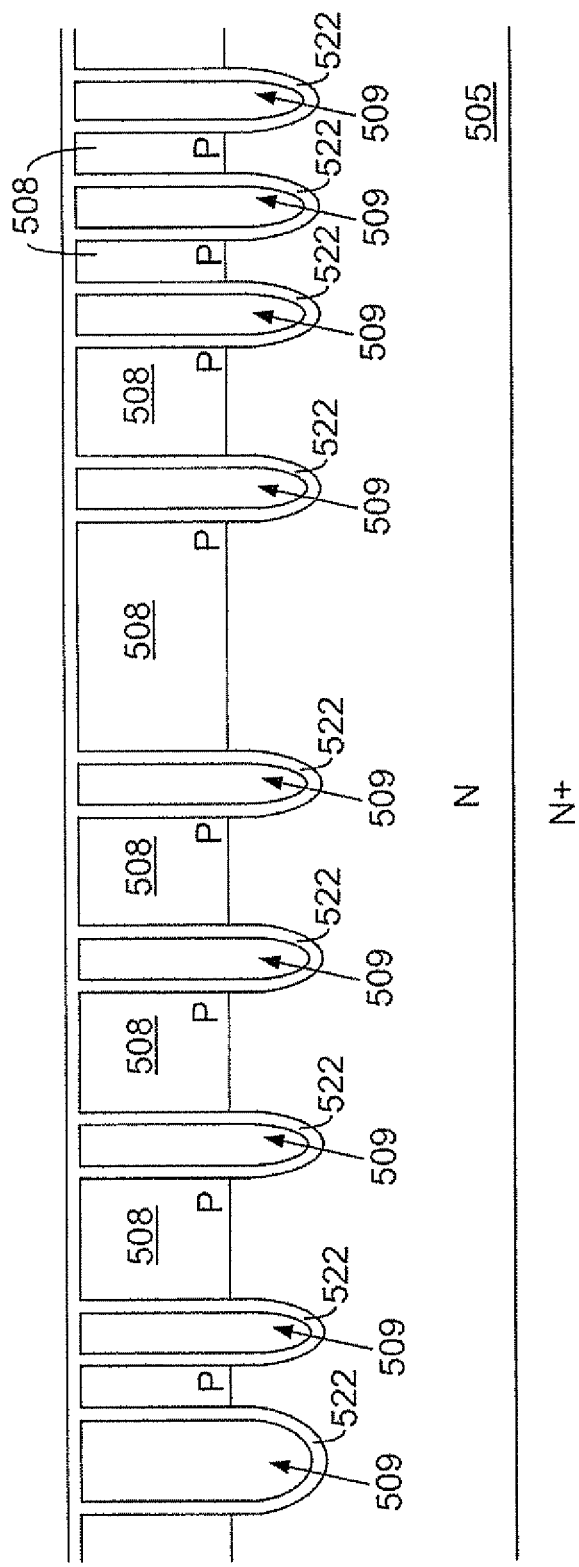

In FIG. 6B, an oxide layer is deposited along an inner surface of all the trenches and along a top surface of the N epitaxial layer 505 to function as a gate insulation layer 522. Then, a doped poly-silicon layer 509 is filled into all the trenches and followed by a poly-silicon CMP (Chemical Mechanical Polishing) or an etching back process to leave the poly-silicon layer within all the trenches, respectively. Thereafter, after carrying out a P dopant ion implantation step and a successive diffusion step, a plurality of P body regions 508 are formed in an upper portion of the N epitaxial layer 505 without a P body mask.

Figure 6C:
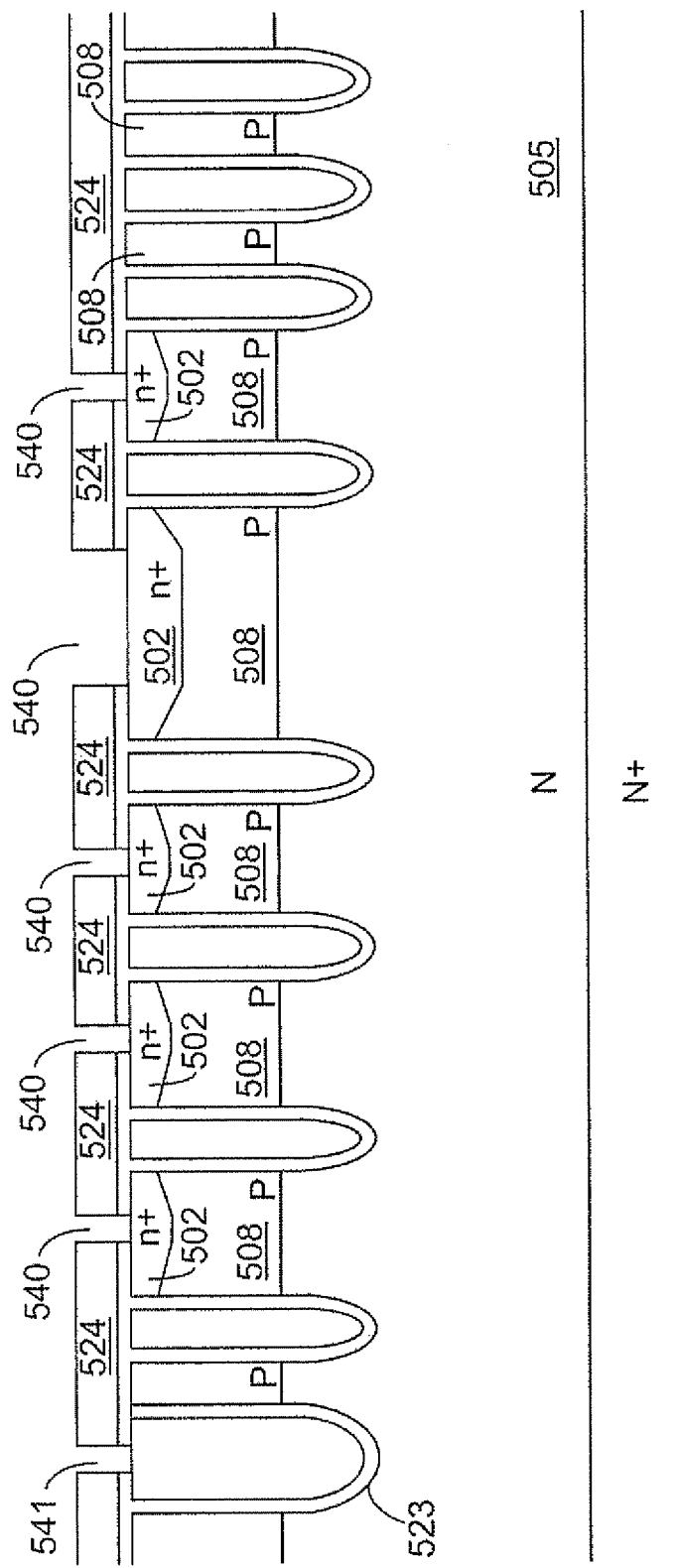

In FIG. 6C, a contact interlayer 524 comprising an un-doped oxide layer is deposited on a top surface of the structure of FIG. 6B. Then, a contact mask (not shown) is employed and then followed by an oxide etching process to define a plurality of contact openings comprising at least one contact opening 541 above the gate contact trench 523 and contact openings 540 exposing a part top surface of the N epitaxial layer 505 for a followed n dopant ion implantation step and a lateral diffusion step after which there form n+ source regions 502 near a top surface of the P body region 508 without a source mask.

Figure 6D:
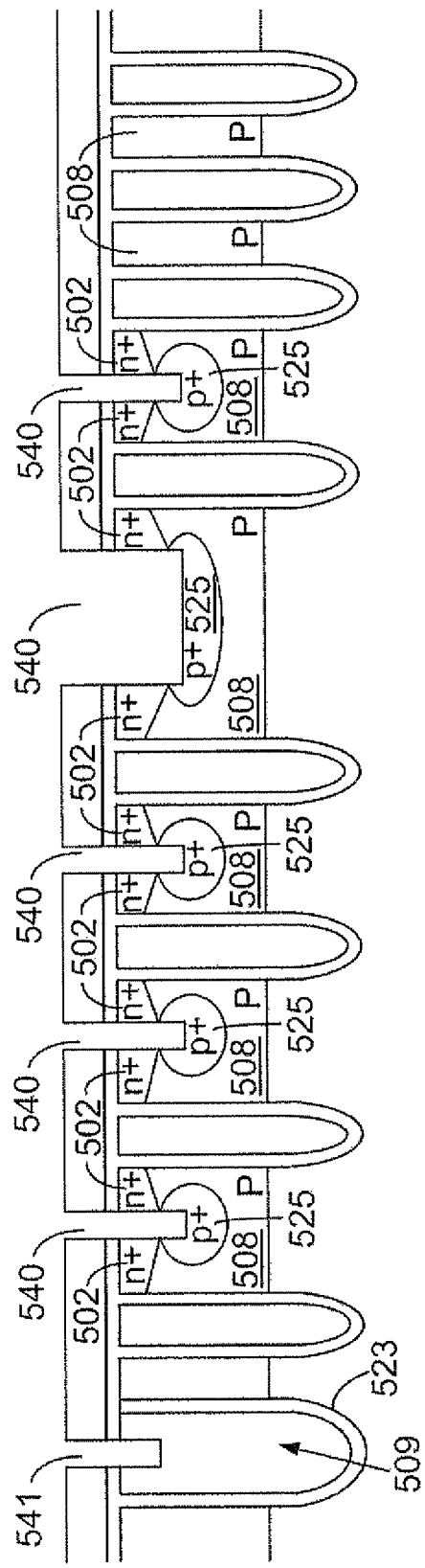

In FIG. 6D, after a silicon etching process, the contact opening 541 is etched to be extending into the poly-silicon 509 in the gate contact trench 523, and the contact openings 540 are respectively etched to be extending through the n+ source region 502 and into the P body region 508. Next, after carrying out a BF2 ion implantation and a step of RTA (Rapid Thermal Annealing) process, a p+ body contact region 525 is formed underneath the n+ source region 502 and surrounding at least bottom of each of the contact openings 540 within the P body region 508.

Figure 6E:
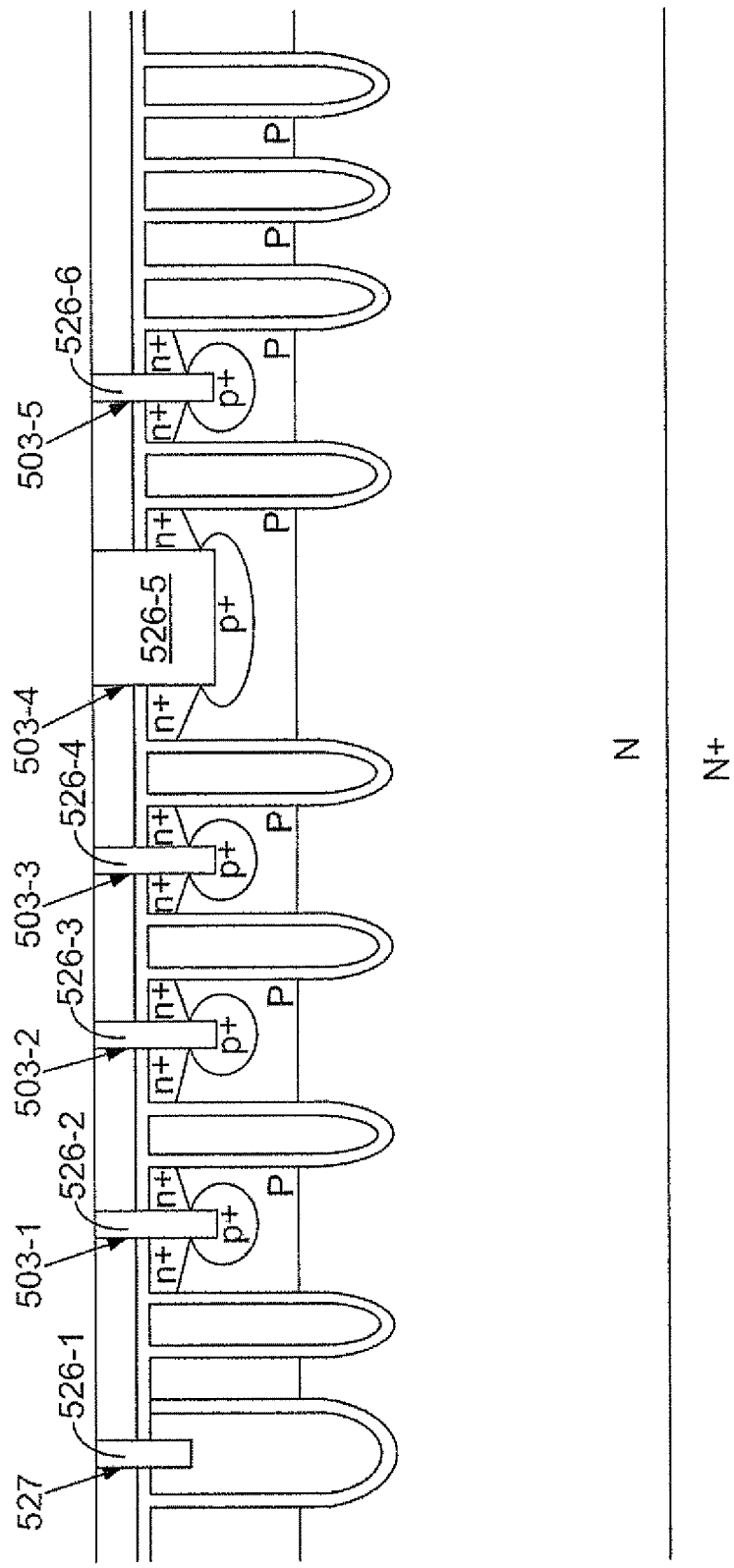

In FIG. 6E, a barrier metal layer Ti/TiN or Co/TiN or Ta/TiN is deposited on sidewalls and bottoms of all the contact openings followed by a step of RTA process for silicide formation. Then, a tungsten material layer is deposited onto the barrier metal layer, wherein the tungsten material layer and the barrier metal layer are then etched back to form contact metal plugs (526-1, 526-2, 526-3, 526-4, 526-5, and 526-6) respectively for a trenched gate contact 527 and trenched source-body contacts (503-1, 503-2, 503-3, 503-4, and 503-5).

Figure 6F:
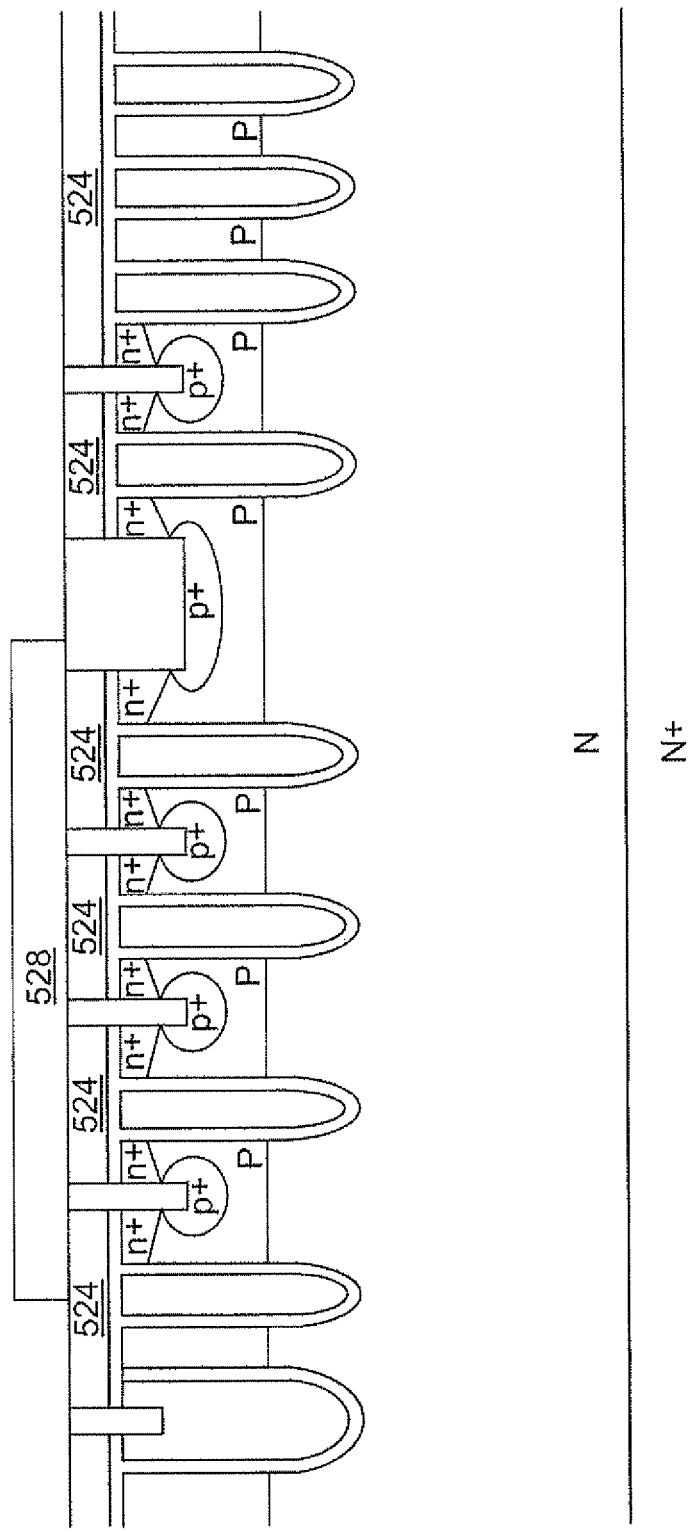
Figure 6G:
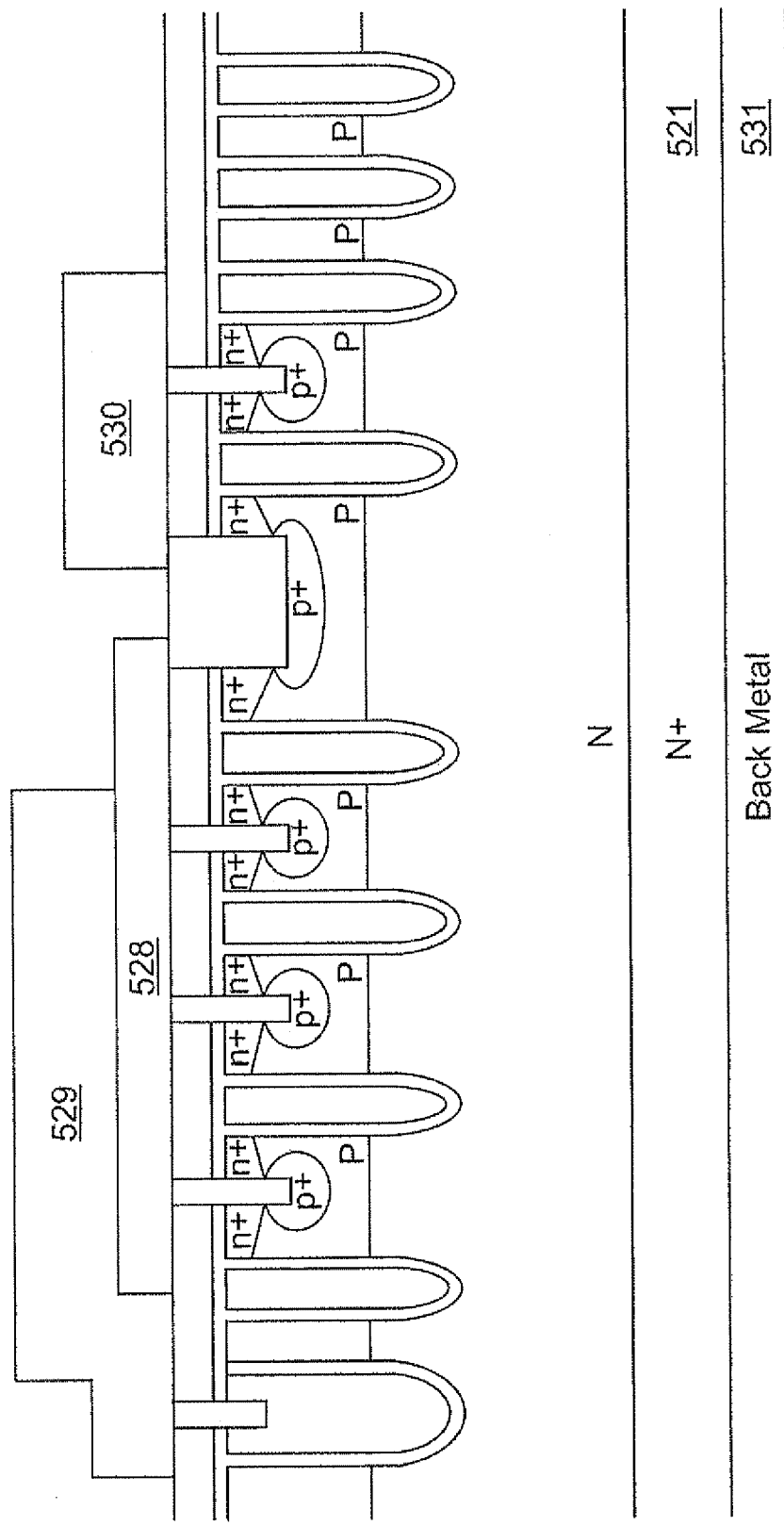

In FIG. 6F, an inter-metal isolation layer 528 is deposited onto the contact interlayer 524 and followed by an etching process by employing an inter-metal isolation layer mask (not shown). In FIG. 6G, a front metal layer of Al alloys or Cu padded by a resistance-reduction layer Ti or Ti/TiN underneath is deposited onto a top surface of the structure in FIG.

6F and followed by a front metal etching process by employing a metal mask (not shown) to form a gate metal pad 529 and a source metal pad 530. The inter-metal isolation layer 528 insulates the active cells under the gate metal pad 529 from the gate metal pad 529. Last, a back metal layer of Ti/Ag/Ni is deposited onto a bottom side of the N+ substrate 521 as a drain metal layer 531 after grinding.

Figure 7A:
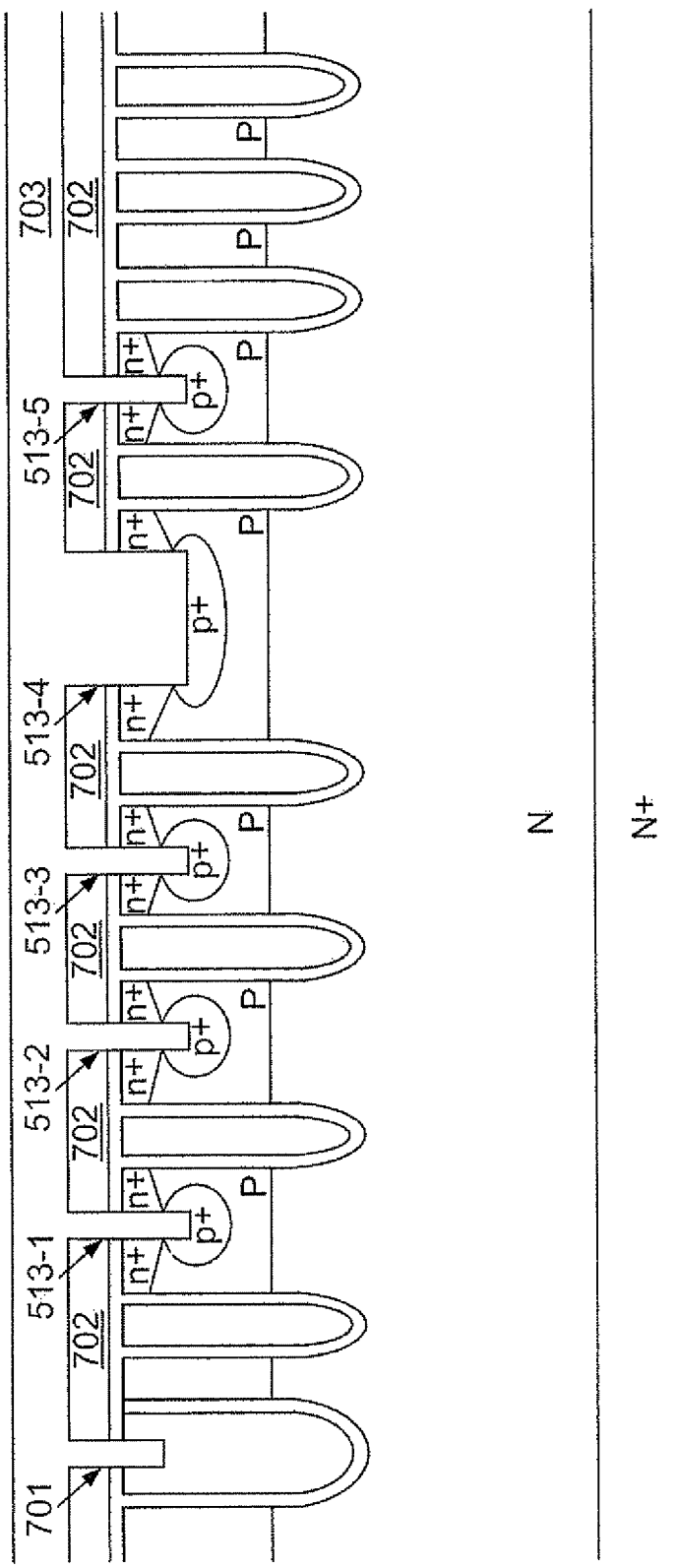
FIGS. 7A to 7D are a serial of cross-sectional views for showing the process steps for manufacturing a trench semiconductor power device as shown in FIG. 5B.

FIGS. 7A to 7D are a serial of cross-sectional views for showing the process steps for manufacturing a trench semiconductor power device as shown in FIG. 5B. The first steps for manufacturing the trench semiconductor power device as shown in FIG. 5B are the same as the first steps (as shown from FIGS. 6A to 6D) for manufacturing the trench semiconductor power device as shown in FIG. 5A, and the process steps as shown in FIG. 7A follow the process steps as shown in FIG. 6D for manufacturing the trench semiconductor power device as shown in FIG. 5B. In FIG. 7A, a barrier metal layer Ti/TiN or Co/TiN or Ta/TiN is deposited on sidewalls and bottoms of all the contact openings followed by a step of RTA process for silicide formation. Then, a tungsten material layer is deposited onto the barrier metal layer, filling all the contact openings to respectively form a trenched gate contact 701 and trenched source-body contacts (513-1, 513-2, 513-3, 513-4, and 513-5) and further extending onto a top surface of the contact interlayer 702 to form a contact metal layer 703.

Figure 7B:
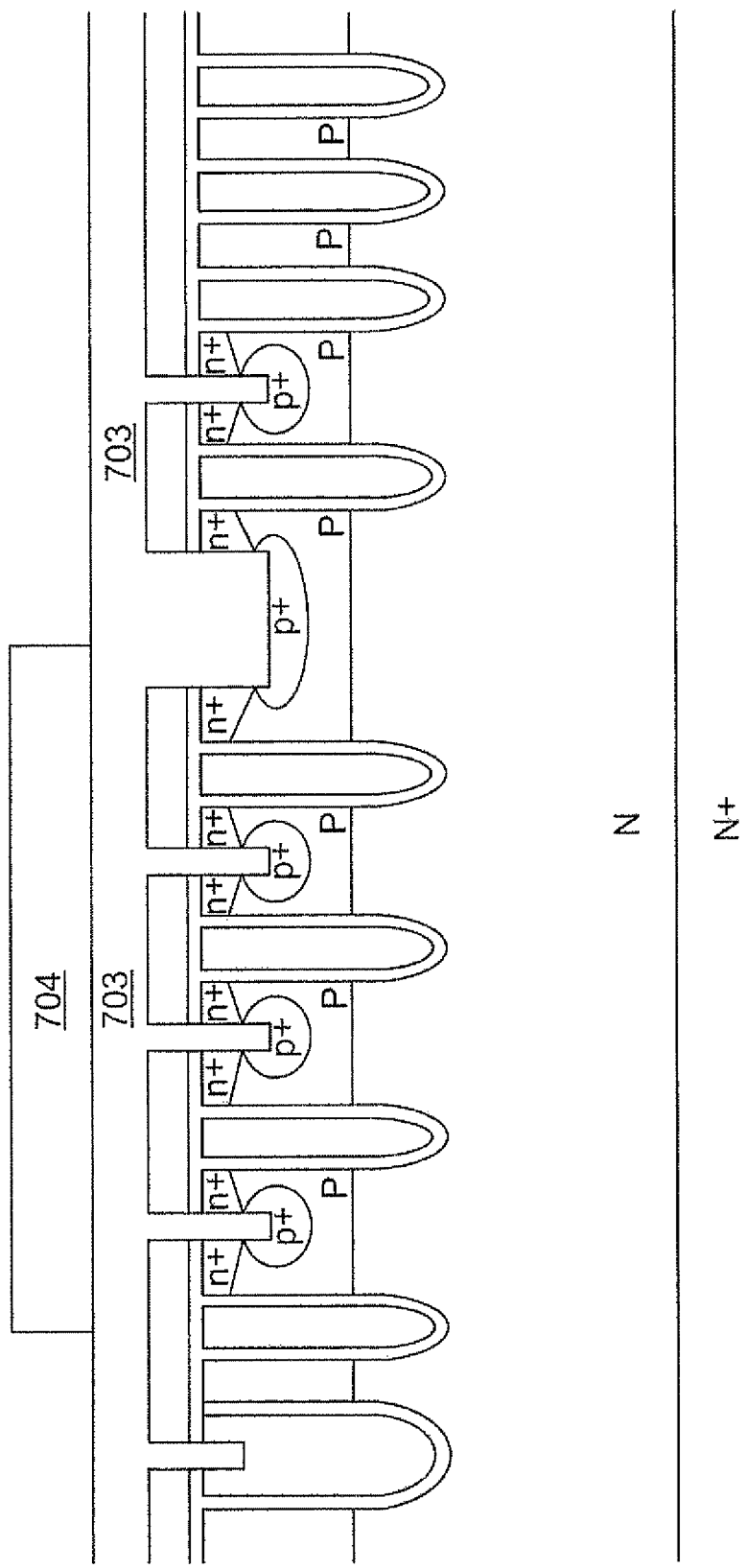
Figure 7C:
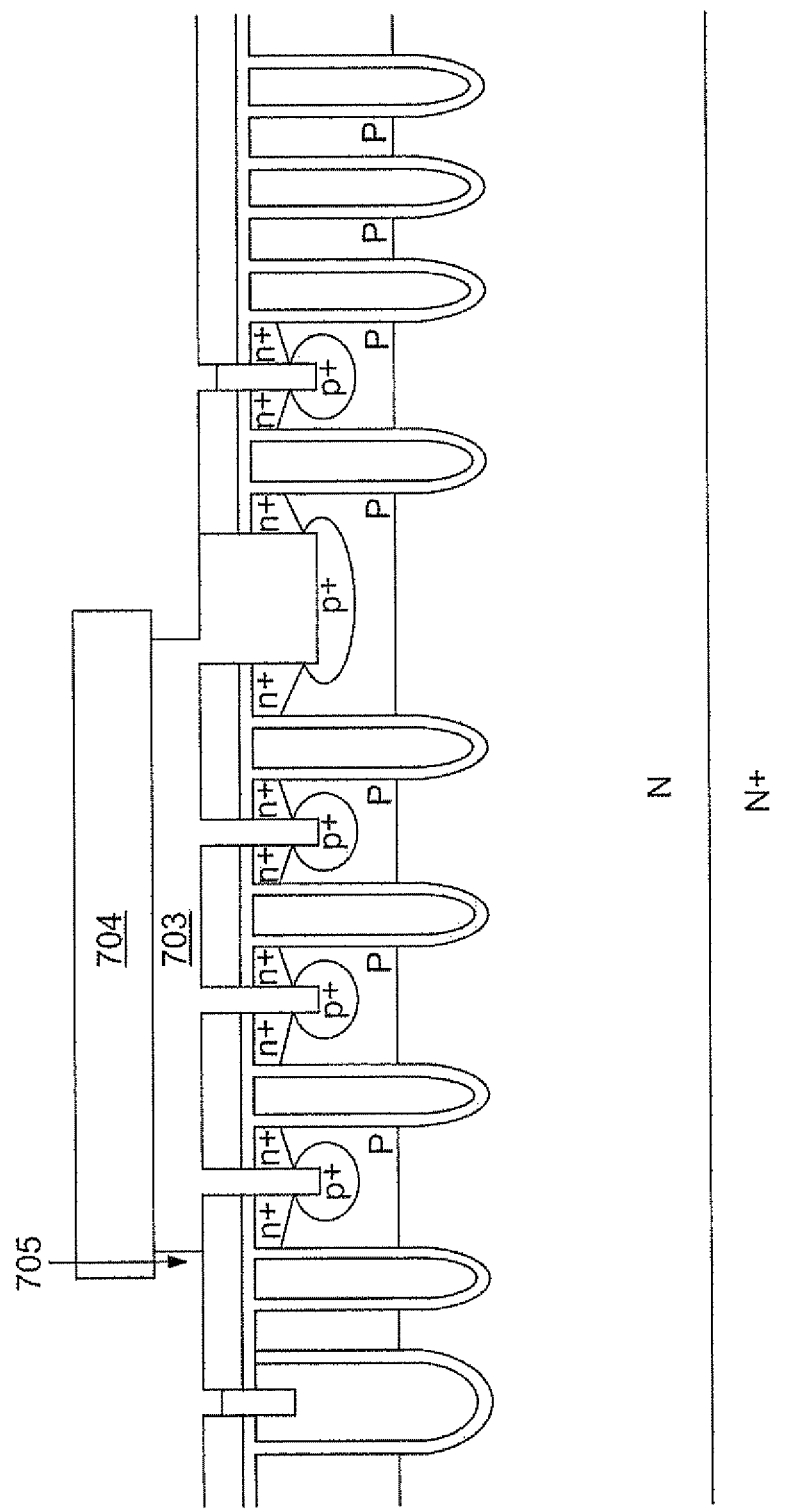
Figure 7D:
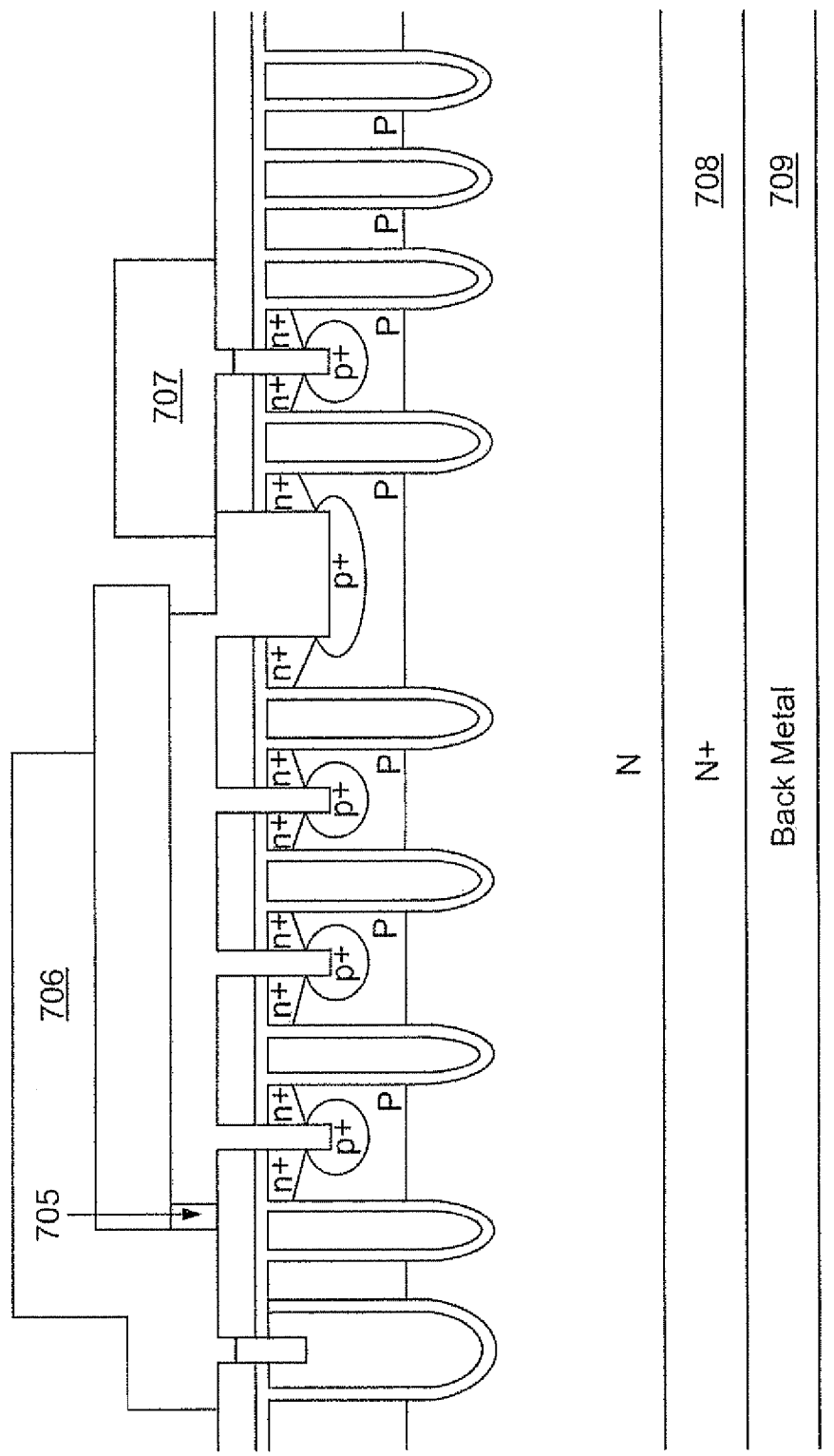

In FIG. 7B, an inter-metal isolation layer 704 is deposited onto the contact metal layer 703 and followed by an etching process by employing an inter-metal isolation layer mask (not shown). In FIG. 7C, the contact metal layer 703 is etched back to leave the portion with a metal undercut 705 under the inter-metal isolation layer 704 to avoid the contact metal layer 703 shortage to a front metal layer. In FIG. 7D, a front metal layer of Al alloys or Cu padded by a resistance-reduction layer Ti or Ti/TiN underneath is deposited onto a top surface of the structure in FIG. 7C and followed by a front metal etching process by employing a metal mask (not shown) to form a gate metal pad 706 and a source metal pad 707. Last, a back metal layer of Ti/Ag/Ni is deposited onto a bottom side of the N+ substrate 708 as a drain metal layer 709 after grinding.

As an alternative to the exemplary embodiment illustrated and described above, the semiconductor power device can also be formed as a trench IGBT. In the case of a trench IGBT, the heavily doped N+ substrate should be replaced by an N+ buffer layer extending over a heavily doped P+ substrate. In this regards, the terminology, such as "source", "body", "drain" should be accordingly replaced by "emitter", "base", "collector".

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench semiconductor power device formed on a semiconductor layer comprising:

a plurality of first type active cells under a source metal pad, each of said first type active cells comprising a first type trenched source-body contact filled with a contact metal plug penetrating through a contact interlayer, a source region of a first conductivity type and extending into a body region of a second conductivity type between a pair of gate trenches filled with poly-silicon padded by a gate insulation layer;

a plurality of second type active cells under a gate metal pad and being insulated from said gate metal pad by an inter-metal isolation layer, each of said second type active cells comprising a second type trenched source-body contact filled with said contact metal plug penetrating through said contact interlayer, said source region and extending into said body region between a pair of said gate trenches filled with poly-silicon; and under both said source metal pad and said gate metal pad, said source region and said body region connected to said source metal pad through said contact metal plug, and said poly-silicon filled into said gate trenches connected to said gate metal pad.

2. The trench semiconductor power device of claim 1, wherein:

said semiconductor layer comprises an epitaxial layer of said first conductivity type onto a buffer layer of said first conductivity type which is extending over a substrate of said second conductivity type.

3. The trench semiconductor power device of claim 1, wherein:

said semiconductor layer comprises an epitaxial layer of said first conductivity type extending over a substrate of said first conductivity type.

4. The trench semiconductor power device of claim 1, wherein:

said first type active cells under said source metal pad are stripe cells and said first type trenched source-body contact is stripe source-body contact.

5. The trench semiconductor power device of claim 1, wherein:

said first type active cells under said source metal pad are closed cells and said first type trenched source-body contact is closed source-body contact.

6. The trench semiconductor power device of claim 1, wherein:

said second type active cells under said gate metal pad are stripe cells and said second type trenched source-body contact is stripe source-body contact.

7. The trench semiconductor power device of claim 1, wherein:

said second type active cells under said gate metal pad are closed cells and said second type trenched source-body contact is closed source-body contact.

8. The trench semiconductor power device of claim 1, wherein:

said contact metal plug filled in each said second type trenched source-body contact having a stripe source-body contact further extending under and connected with said source metal pad.

9. The trench semiconductor power device of claim 1, wherein:

said contact metal plug filled in each said second type trenched source-body contact is further extending over a top surface of said contact interlayer as a contact metal layer to connect said first type trenched source-body contact via said source metal pad wherein said contact metal layer is sandwiched between the top surface of said contact interlayer and a bottom surface of said inter-metal isolation layer.

10. The trench semiconductor power device of claim 9, wherein:

said contact metal layer further extends under said source metal pad and fills in said first type trenched source-body contact.

11. The trench semiconductor power device of claim 9, wherein:
said contact metal layer is separated from said gate metal pad by a metal undercut and by said inter-metal isolation layer in horizontal direction and in vertical direction, respectively.

12. The trench semiconductor power device of claim 10, wherein:
said contact metal layer is separated from said gate metal pad by said inter-metal isolation layer both in horizontal direction and in vertical direction.

13. The trench semiconductor power device of claim 1, wherein:
said source region has a higher doping concentration and a greater junction depth along sidewalls of each said first type trenched source-body contact and each said second type trenched source-body contact than along an adjacent channel region near said gate trenches at a same distance from a top surface of said semiconductor layer, and said source region has a doping profile of Gaussian-distribution along the top surface of said semiconductor layer from the sidewalls of each said first type trenched source-body contact and each said second type trenched source-body contact to said adjacent channel region.

14. The trench semiconductor power device of claim 1, wherein:
said source region has a same doping concentration and a same junction depth at a same distance from a top surface of said semiconductor layer.

15. The trench semiconductor power device of claim 1 further comprising:
at least one gate contact trench filled with said poly-silicon padded by said gate insulation layer and having a greater trench width than said gate trenches.

16. The trench semiconductor power device of claim 14 further comprising:
a trenched gate contact filled with said contact metal plug and penetrating through said contact interlayer and extending into the poly-silicon filled in said gate contact trench to be connected to said gate metal pad for gate connection.

17. The trench semiconductor power device of claim 1 further comprising:
a termination area comprising multiple terminal trenches being spaced apart by said body region, wherein said multiple terminal trenches are filled with the poly-silicon having a floating voltage to function as trenched floating gates in said termination area.

18. The trench semiconductor power device of claim 1, wherein:
said contact metal plug is a tungsten (W) plug padded by a barrier metal layer of Ti/TiN or Co/TiN or Ta/TiN.

19. A method for manufacturing a trench semiconductor power device, comprising:
forming active cells under a gate metal pad, wherein said active cells under said gate metal pad having source and body regions being connected to a source metal pad and being insulated from said gate metal pad by an inter-metal isolation layer.

20. The method of claim 19, wherein:
said inter-metal isolation layer is formed by employing an inter-metal isolation layer mask.

21. The method of claim 19 further comprising:
forming a contact metal plug in a trenched source-body contact to connect each of said active cells under said gate metal pad to said source metal pad.

22. The method of claim 21 further comprising:
forming a contact metal layer to connect each said contact metal plug of said active cells under said gate metal pad to said source metal pad by employing a tungsten (W) mask.

23. The method of claim 21 further comprising:
forming a contact metal layer to connect each said contact metal plug of said active cells under said gate metal pad to said source metal pad without a tungsten (W) mask.

24. The method of claim 19 further comprising:
forming a source region without requiring a source mask by carrying out a source dopant ion implantation through a contact opening which is formed penetrating through a contact interlayer to expose a top surface of a semiconductor layer.

* * * * *